United States Patent
Kim et al.

(10) Patent No.: US 11,353,976 B2
(45) Date of Patent: *Jun. 7, 2022

(54) METHOD FOR MANUFACTURING TOUCH INPUT DEVICE AND TOUCH INPUT DEVICE

(71) Applicant: HiDeep Inc., Gyeonggi-do (KR)

(72) Inventors: Bonkee Kim, Gyeonggi-do (KR); Seyeob Kim, Gyeonggi-do (KR)

(73) Assignee: HiDeep Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/080,798

(22) Filed: Oct. 26, 2020

(65) Prior Publication Data

US 2021/0064174 A1 Mar. 4, 2021

Related U.S. Application Data

(63) Continuation of application No. 16/032,627, filed on Jul. 11, 2018, now Pat. No. 10,817,091.

(30) Foreign Application Priority Data

Jul. 18, 2017 (KR) .......................... 1020170090899

(51) Int. Cl.
*G06F 3/041* (2006.01)
*G02F 1/1333* (2006.01)
(Continued)

(52) U.S. Cl.
CPC .......... *G06F 3/0412* (2013.01); *G02F 1/1339* (2013.01); *G02F 1/13338* (2013.01);
(Continued)

(58) Field of Classification Search
CPC .... G06F 3/0412; G06F 3/0445; G06F 3/0446; G06F 3/0443; G06F 3/0414;
(Continued)

(56) References Cited

U.S. PATENT DOCUMENTS 6,441,451 B1 8/2002 Ikeda et al.
6,756,248 B2 6/2004 Ikeda et al.
(Continued)

FOREIGN PATENT DOCUMENTS

CN 106843580 6/2017
JP 2014-241128 12/2014
(Continued)

*Primary Examiner* — Prabodh M Dharia
(74) *Attorney, Agent, or Firm* — The Belles Group, P.C.

(57) ABSTRACT

Technologies for manufacturing a touch input device are disclosed. The method includes: forming, on a single carrier substrate, a flexible display for each of a plurality of display devices, cutting the flexible display into individual pieces, and separating the flexible display from the carrier substrate; a separate structure different from electrodes may be used to detect touch position forming step of forming, under a single substrate, a separate structure different from electrodes may be used to detect touch position for each of the plurality of display devices and cutting the substrate for the separate structure into individual pieces; and adhering each of the individual pieces of the separated flexible display to an individual piece of the substrate for the separate structure. The substrate for the separate structure may not be relatively easily bent as compared to the flexible display.

15 Claims, 19 Drawing Sheets

(51) Int. Cl.

| | | |
|---|---|---|
| *G02F 1/1335* | (2006.01) | |
| *G02F 1/1362* | (2006.01) | |
| *G02F 1/1339* | (2006.01) | |
| *H01L 27/32* | (2006.01) | |
| *H01L 51/00* | (2006.01) | |
| *G06F 3/044* | (2006.01) | |

(52) U.S. Cl.
CPC .. *G02F 1/133305* (2013.01); *G02F 1/133351* (2013.01); *G02F 1/133512* (2013.01); *G02F 1/133528* (2013.01); *G02F 1/136286* (2013.01); *G06F 3/044* (2013.01); *G06F 3/0414* (2013.01); *G06F 3/0416* (2013.01); *G06F 3/0443* (2019.05); *G06F 3/0445* (2019.05); *G06F 3/0446* (2019.05); *H01L 27/323* (2013.01); *H01L 27/3262* (2013.01); *H01L 27/3272* (2013.01); *H01L 27/3276* (2013.01); *H01L 51/003* (2013.01); *H01L 51/0013* (2013.01); *G06F 2203/04103* (2013.01); *G06F 2203/04105* (2013.01); *G06F 2203/04107* (2013.01); *H01L 51/0097* (2013.01); *H01L 2251/5338* (2013.01)

(58) Field of Classification Search
CPC .. G06F 3/0416; G06F 3/044; G02F 1/133305; G02F 1/133351; G02F 1/13338; G02F 1/133512; G02F 1/133528; G02F 1/1339; G02F 1/136286; H01L 27/323; H01L 27/3262; H01L 27/3272; H01L 27/3276; H01L 51/0013; H01L 51/003

USPC ............................... 345/173; 349/12; 438/23
See application file for complete search history.

(56) References Cited

U.S. PATENT DOCUMENTS

| | | | |
|---|---|---|---|
| 9,582,087 B2 | 2/2017 | Kang | |
| 2009/0065267 A1 | 3/2009 | Sato | |
| 2012/0299859 A1* | 11/2012 | Kinoshita | ........... G06F 3/04186 345/173 |
| 2014/0081160 A1 | 3/2014 | Xiang | |
| 2014/0327643 A1 | 11/2014 | Sun et al. | |
| 2015/0015805 A1 | 1/2015 | Kim et al. | |
| 2015/0050758 A1* | 2/2015 | Ko | ...................... H01L 27/3223 438/23 |
| 2016/0062500 A1 | 3/2016 | Kessler et al. | |
| 2016/0147362 A1* | 5/2016 | Eim | ...................... G06F 3/0416 345/173 |
| 2017/0123533 A1 | 5/2017 | Jo | |
| 2017/0271625 A1* | 9/2017 | Liu | ................... H01L 21/76867 |
| 2018/0011591 A1* | 1/2018 | Tomizu | ................... G06F 3/016 |
| 2018/0203562 A1* | 7/2018 | An | ........................ G06F 1/3218 |
| 2018/0329558 A1* | 11/2018 | Park | ...................... G06F 3/0414 |
| 2019/0384441 A1* | 12/2019 | Seo | ...................... G06F 3/04182 |
| 2020/0279891 A1* | 9/2020 | Su | ........................ G06F 3/0416 |

FOREIGN PATENT DOCUMENTS

| | | |
|---|---|---|
| JP | 2015-064468 | 4/2015 |
| JP | 6777677 | 10/2020 |
| KR | 1020120002394 | 1/2012 |
| KR | 1020140066441 | 6/2014 |
| TW | 201200933 | 1/2012 |

\* cited by examiner

METHOD FOR MANUFACTURING TOUCH INPUT DEVICE AND TOUCH INPUT DEVICE

CROSS REFERENCE TO RELATED APPLICATIONS

Priority is claimed as a continuation application to U.S. patent application Ser. No. 16/032,627, filed Jul. 11, 2018, which claims priority under 35 U.S.C. § 119 to Korean Patent Application No. 10-2017-0090899, filed Jul. 18, 2017, the disclosures of which are incorporated herein in its entirety.

BACKGROUND

Field

The present disclosure relates to a method for manufacturing a touch input device and the touch input device and more particularly to a method for manufacturing a touch input device, which adheres a cut substrate for a pressure sensor to a cut flexible display, thereby causing the pressure sensor to be easily implemented on the flexible display, and the touch input device.

Description of the Related Art

Various kinds of input devices are being used to operate a computing system. For example, the input device includes a button, key, joystick and touch screen. Since the touch screen is easy and simple to operate, the touch screen is increasingly being used to operate the computing system.

The touch screen may constitute a touch surface of a touch input device including a touch sensor panel which may be a transparent panel including a touch-sensitive surface. The touch sensor panel is attached to the front side of a display screen, and then the touch-sensitive surface may cover the visible side of the display screen. The touch screen allows a user to operate the computing system by simply touching the touch screen by a finger, etc. Generally, the computing system recognizes the touch and a position of the touch on the touch screen and analyzes the touch, and thus, performs operations in accordance with the analysis.

Here, there is a demand for a touch input device capable of detecting not only the touch position according to the touch on the touch screen but a pressure magnitude of the touch without degrading the performance of a display module.

Particularly, when the display panel is a flexible OLED panel, the display panel is very thin and tends to be easily bent. Therefore, it is difficult to implement a pressure sensor on the flexible OLED panel during the manufacturing process thereof.

BRIEF SUMMARY

One embodiment is a method for manufacturing a touch input device. The method includes: a display forming step of forming a flexible display for a plurality of display devices on one carrier substrate, cutting the flexible display into individual pieces, and separating the flexible display from the carrier substrate; a pressure sensor forming step of forming a pressure sensor for the plurality of display devices on one substrate for the pressure sensor and cutting the substrate for the pressure sensor into individual pieces; and an adhering step of adhering the separated flexible display to the substrate for the pressure sensor, which has been cut into individual pieces.

Another embodiment is a touch input device including: a cut flexible display which is cut into individual pieces for a plurality of display devices and is separated from a carrier substrate; a cut substrate for a pressure sensor, which is cut into individual pieces for the plurality of display devices and has the pressure sensor formed thereon; and an adhesive which adheres the separated cut flexible display to the substrate for the pressure sensor, which is cut into individual pieces.

Another embodiment is a method for manufacturing a touch input device. The method includes: a step of forming a flexible display for a plurality of display devices on one carrier substrate; a step of separating the flexible display from the carrier substrate; a step of forming a pressure sensor for the plurality of display devices on one substrate for the pressure sensor; a step of adhering the separated flexible display to the substrate for the pressure sensor; and a step of cutting the substrate for the pressure sensor and the flexible display which have been adhered to each other into individual pieces.

Yet another embodiment is a method for manufacturing a touch input device. The method includes: a display forming step of forming, on a single carrier substrate, a flexible display for each of a plurality of display devices, cutting the flexible display into individual pieces, and separating the flexible display from the carrier substrate; a separate structure different from electrodes used to detect touch position forming step of forming, under a single substrate, a separate structure different from electrodes used to detect touch position for each of the plurality of display devices and cutting the substrate for the separate structure into individual pieces; and an adhering step of adhering each of the individual pieces of the separated flexible display to an individual piece of the substrate for the separate structure. The substrate for the separate structure may not be relatively easily bent as compared to the flexible display.

DETAILED DESCRIPTION

Figure 1A:
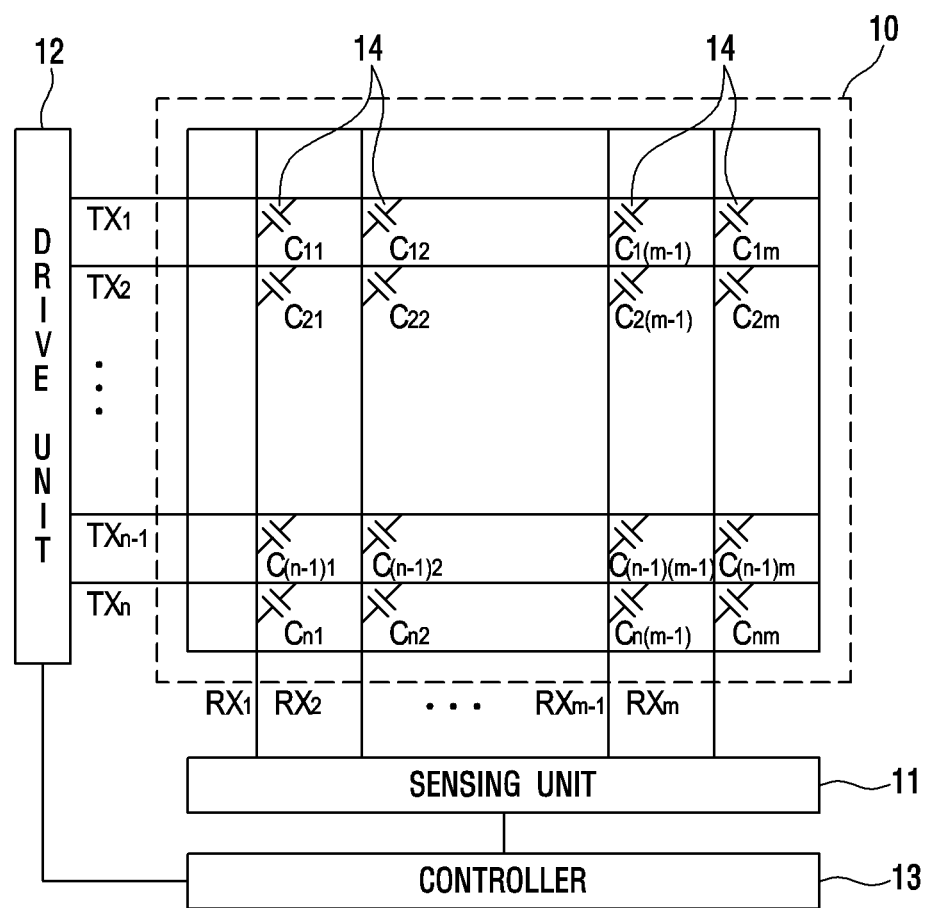
FIGS. 1a and 1b are schematic views of a configuration of a capacitance type touch sensor included in a touch input device according to an embodiment of the present invention and the operation of the capacitance type touch sensor.

The following detailed description of the present invention shows a specified embodiment of the present invention and will be provided with reference to the accompanying drawings. The embodiment will be described in enough detail that those skilled in the art are able to embody the present invention. It should be understood that various embodiments of the present invention are different from each other and need not be mutually exclusive. For example, a specific shape, structure and properties, which are described in this disclosure, may be implemented in other embodiments without departing from the spirit and scope of the present invention with respect to one embodiment. Also, it should be noted that positions or placements of individual components within each disclosed embodiment may be changed without departing from the spirit and scope of the present invention. Therefore, the following detailed description is not intended to be limited. If adequately described, the scope of the present invention is limited only by the appended claims of the present invention as well as all equivalents thereto. Similar reference numerals in the drawings designate the same or similar functions in many aspects.

Hereinafter, a touch input device according to an embodiment of the present invention will be described with reference to the accompanying drawings. Hereinafter, while a capacitive touch sensor panel and a pressure detection module are exemplified below, it is possible to apply a touch sensor panel and a pressure detection module which are capable of detecting a touch position and/or a touch pressure in any manner.

FIG. 1*a* is schematic views of a configuration of the capacitance type touch sensor 10 included in the touch input device according to the embodiment of the present invention and the operation of the capacitance type touch sensor. Referring to FIG. 1*a*, the touch sensor 10 may include a plurality of drive electrodes TX1 to TXn and a plurality of receiving electrodes RX1 to RXm, and may include a drive unit 12 which applies a drive signal to the plurality of the drive electrodes TX1 to TXn for the purpose of the operation of the touch sensor 10, and a sensing unit 11 which detects the touch and the touch position by receiving from the plurality of the receiving electrodes RX1 to RXm a sensing signal including information on a capacitance change amount changing according to the touch on a touch surface.

As shown in FIG. 1*a*, the touch sensor 10 may include the plurality of drive electrodes TX1 to TXn and the plurality of receiving electrodes RX1 to RXm. While FIG. 1*a* shows that the plurality of drive electrodes TX1 to TXn and the plurality of receiving electrodes RX1 to RXm of the touch sensor 10 form an orthogonal array, the present invention is not limited to this. The plurality of drive electrodes TX1 to TXn and the plurality of receiving electrodes RX1 to RXm has an array of arbitrary dimension, for example, a diagonal array, a concentric array, a 3-dimensional random array, etc., and an array obtained by the application of them. Here, "n" and "m" are positive integers and may be the same as each other or may have different values. The magnitude of the value may be changed depending on the embodiment.

The plurality of drive electrodes TX1 to TXn and the plurality of receiving electrodes RX1 to RXm may be arranged to cross each other. The drive electrode TX may include the plurality of drive electrodes TX1 to TXn extending in a first axial direction. The receiving electrode RX may include the plurality of receiving electrodes RX1 to RXm extending in a second axial direction crossing the first axial direction.

Figure 9A:
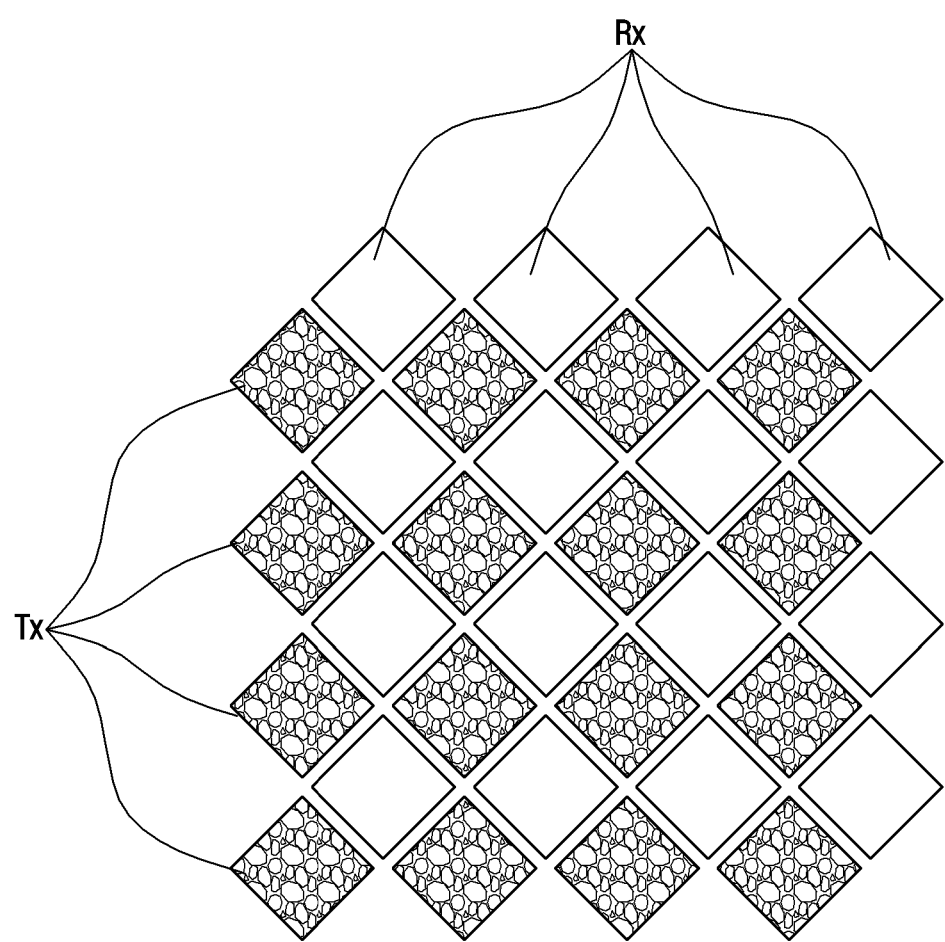
FIGS. 9*a* to 9*d* show the forms of an electrode included in the touch input device according to the embodiment of the present invention.
Figure 9B:
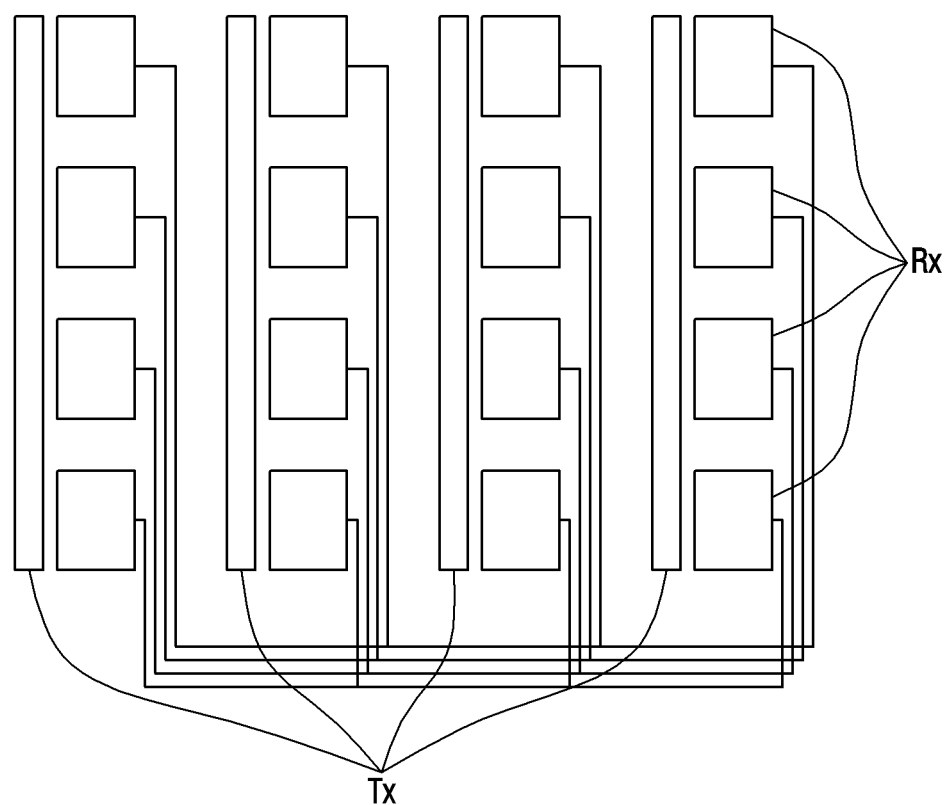
Figure 9C:
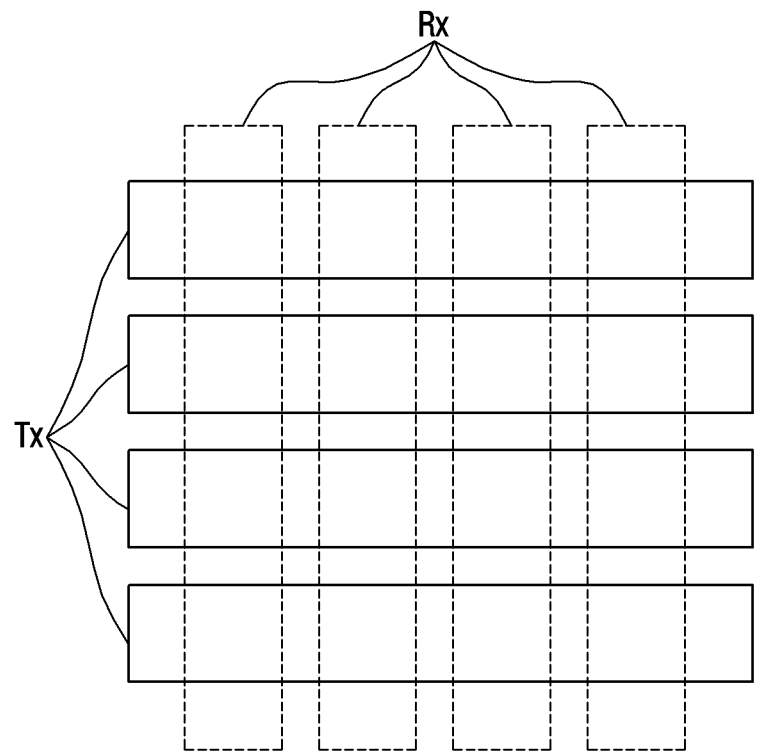

As shown in FIGS. 9*a* and 9*b*, in the touch sensor 10 according to the embodiment of the present invention, the plurality of drive electrodes TX1 to TXn and the plurality of receiving electrodes RX1 to RXm may be formed in the same layer. For example, the plurality of drive electrodes TX1 to TXn and the plurality of receiving electrodes RX1 to RXm may be formed on a top surface of a display panel 200A to be described later.

Also, as shown in FIG. 16*c*, the plurality of drive electrodes TX1 to TXn and the plurality of receiving electrodes RX1 to RXm may be formed in different layers. For example, any one of the plurality of drive electrodes TX1 to TXn and the plurality of receiving electrodes RX1 to RXm may be formed on the top surface of the display panel 200A, and the other may be formed on a bottom surface of a cover to be described later or may be formed within the display panel 200A.

The plurality of drive electrodes TX1 to TXn and the plurality of receiving electrodes RX1 to RXm may be made of a transparent conductive material (for example, indium tin oxide (ITO) or antimony tin oxide (ATO) which is made of tin oxide ($SnO_2$), and indium oxide ($In_2O_3$), etc.), or the like. However, this is only an example. The drive electrode TX and the receiving electrode RX may be also made of another transparent conductive material or an opaque conductive material. For instance, the drive electrode TX and the receiving electrode RX may include at least any one of silver ink, copper, and carbon nanotube (CNT). Also, the drive electrode TX and the receiving electrode RX may be made of metal mesh.

The drive unit 12 according to the embodiment of the present invention may apply a drive signal to the drive electrodes TX1 to TXn. In the embodiment of the present invention, one drive signal may be sequentially applied at a time to the first drive electrode TX1 to the n-th drive electrode TXn. The drive signal may be applied again repeatedly. This is only an example. The drive signal may be applied to the plurality of drive electrodes at the same time in accordance with the embodiment.

Through the receiving electrodes RX1 to RXm, the sensing unit 11 receives the sensing signal including information on a capacitance (Cm) 14 generated between the receiving electrodes RX1 to RXm and the drive electrodes TX1 to TXn to which the driving signal has been applied, thereby detecting whether or not the touch has occurred and where the touch has occurred. For example, the sensing signal may be a signal coupled by the capacitance (Cm) 14 generated between the receiving electrode RX and the drive electrode TX to which the driving signal has been applied. As such, the process of sensing the driving signal applied from the first drive electrode TX1 to the n-th drive electrode TXn through the receiving electrodes RX1 to RXm can be referred to as a process of scanning the touch sensor 10.

For example, the sensing unit 11 may include a receiver (not shown) which is connected to each of the receiving electrodes RX1 to RXm through a switch. The switch becomes the on-state in a time interval during which the signal of the corresponding receiving electrode RX is sensed, thereby allowing the receiver to sense the sensing signal from the receiving electrode RX. The receiver may include an amplifier (not shown) and a feedback capacitor coupled between the negative (−) input terminal of the amplifier and the output terminal of the amplifier, i.e., coupled to a feedback path. Here, the positive (+) input terminal of the amplifier may be connected to the ground. Also, the receiver may further include a reset switch which is connected in parallel with the feedback capacitor. The reset switch may reset the conversion from current to voltage that is performed by the receiver. The negative input terminal of the amplifier is connected to the corresponding receiving electrode RX and receives and integrates a current signal including information on the capacitance (Cm) 14, and then converts the integrated current signal into voltage. The sensing unit 11 may further include an analog to digital converter (ADC) (not shown) which converts the integrated data by the receiver into digital data. Later, the digital data may be input to a processor (not shown) and processed to obtain information on the touch on the touch sensor 10. The sensing unit 11 may include the ADC and processor as well as the receiver.

A controller 13 may perform a function of controlling the operations of the drive unit 12 and the sensing unit 11. For example, the controller 13 generates and transmits a drive control signal to the drive unit 12, so that the driving signal can be applied to a predetermined drive electrode TX1 at a predetermined time. Also, the controller 13 generates and transmits the drive control signal to the sensing unit 11, so that the sensing unit 11 may receive the sensing signal from the predetermined receiving electrode RX at a predetermined time and perform a predetermined function.

In FIG. 1a, the drive unit 12 and the sensing unit 11 may constitute a touch detection device (not shown) capable of detecting whether the touch has occurred on the touch sensor 10 or not and where the touch has occurred. The touch detection device may further include the controller 13. In the touch input device including the touch sensor 10, the touch detection device may be integrated and implemented on a touch sensing integrated circuit (IC) corresponding to a below-described touch sensor controller 1100. The drive electrode TX and the receiving electrode RX included in the touch sensor 10 may be connected to the drive unit 12 and the sensing unit 11 included in the touch sensing IC through, for example, a conductive trace and/or a conductive pattern printed on a circuit board, or the like. The touch sensing IC may be placed on a circuit board on which the conductive pattern has been printed, for example, a touch circuit board (hereafter, referred to as a touch PCB) in FIGS. 6a to 6f. According to the embodiment, the touch sensing IC may be mounted on a main board for operation of the touch input device.

As described above, a capacitance (Cm) with a predetermined value is generated at each crossing of the drive electrode TX and the receiving electrode RX. When an object like a finger approaches close to the touch sensor 10, the value of the capacitance may be changed. In FIG. 1a, the capacitance may represent a mutual capacitance (Cm). The sensing unit 11 senses such electrical characteristics, thereby being able to sense whether the touch has occurred on the touch sensor 10 or not and where the touch has occurred. For example, the sensing unit 11 is able to sense whether the touch has occurred on the surface of the touch sensor 10 comprised of a two-dimensional plane consisting of a first axis and a second axis.

More specifically, when the touch occurs on the touch sensor 10, the drive electrode TX to which the driving signal has been applied is detected, so that the position of the second axial direction of the touch can be detected. Likewise, when the touch occurs on the touch sensor 10, the capacitance change is detected from the reception signal received through the receiving electrode RX, so that the position of the first axial direction of the touch can be detected.

Up to now, although the operation mode of the touch sensor 10 sensing the touch position has been described on the basis of the mutual capacitance change amount between the drive electrode TX and the receiving electrode RX, the embodiment of the present invention is not limited to this. That is, as shown in FIG. 1b, it is also possible to detect the touch position on the basis of the change amount of a self-capacitance.

Figure 1B:
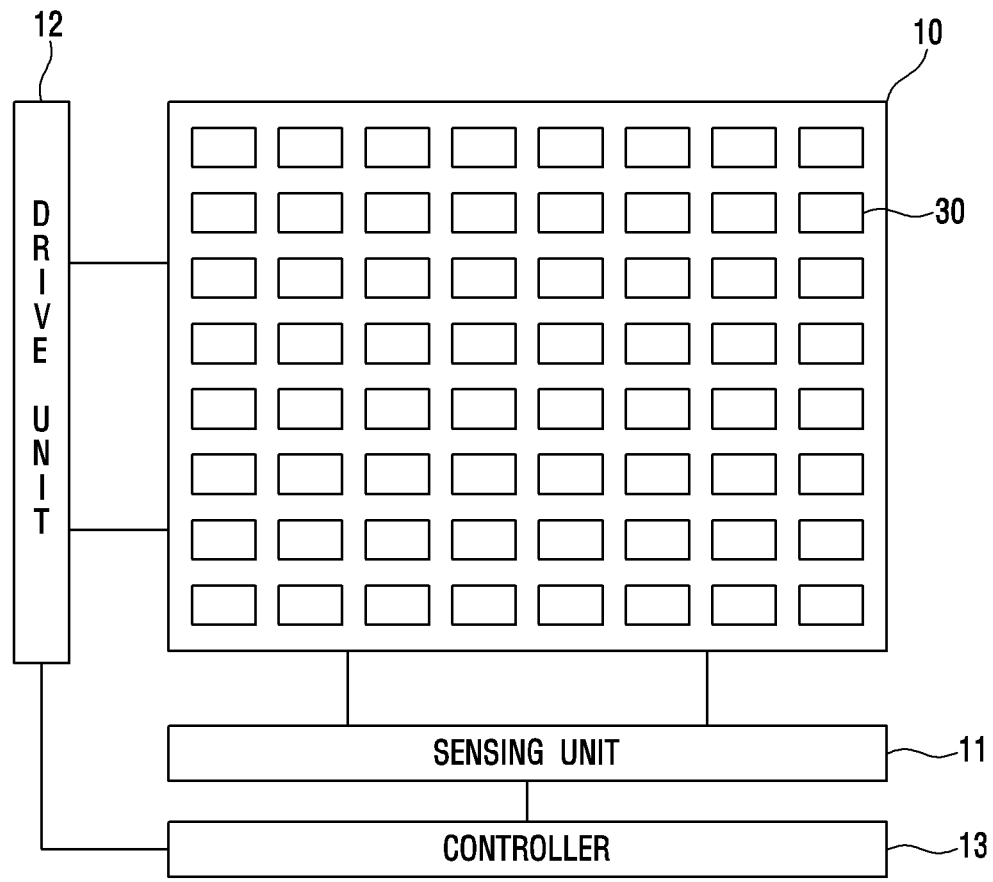
Figure 9D:
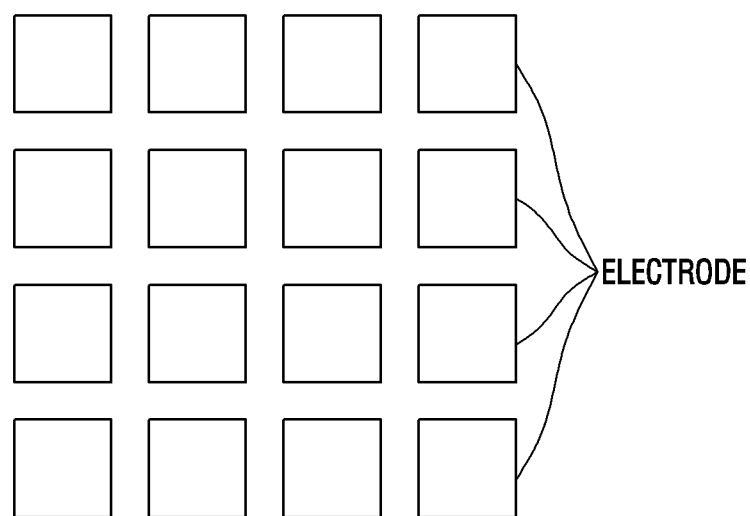

FIG. 1b is schematic views of a configuration of another capacitance type touch sensor 10 included in the touch input device according to another embodiment of the present invention and the operation of the capacitance type touch sensor. A plurality of touch electrodes 30 are provided on the touch sensor 10 shown in FIG. 1b. Although the plurality of touch electrodes 30 may be, as shown in FIG. 9d, disposed at a regular interval in the form of a grid, the present invention is not limited to this.

The drive control signal generated by the controller 13 is transmitted to the drive unit 12. On the basis of the drive control signal, the drive unit 12 applies the drive signal to the predetermined touch electrode 30 for a predetermined time period. Also, the drive control signal generated by the controller 13 is transmitted to the sensing unit 11. On the basis of the drive control signal, the sensing unit 11 receives the sensing signal from the predetermined touch electrode 30 for a predetermined time period. Here, the sensing signal may be a signal for the change amount of the self-capacitance formed on the touch electrode 30.

Here, whether the touch has occurred on the touch sensor 10 or not and/or the touch position are detected by the sensing signal detected by the sensing unit 11. For example, since the coordinate of the touch electrode 30 has been known in advance, whether the touch of the object on the surface of the touch sensor 10 has occurred or not and/or the touch position can be detected.

In the foregoing, for convenience of description, it has been described that the drive unit 12 and the sensing unit 11 operate individually as a separate block. However, the operation to apply the drive signal to the touch electrode 30 and to receive the sensing signal from the touch electrode 30 can be also performed by one drive and sensing unit.

The foregoing has described in detail the capacitance type touch sensor as the touch sensor 10. However, in the touch input device 1000 according to the embodiment of the present invention, the touch sensor 10 for detecting whether or not the touch has occurred and the touch position may be implemented by using not only the above-described method but also any touch sensing method such as a surface capacitance type method, a projected capacitance type method, a resistance film method, a surface acoustic wave (SAW) method, an infrared method, an optical imaging method, a dispersive signal technology, and an acoustic pulse recognition method, etc.

Figure 2:
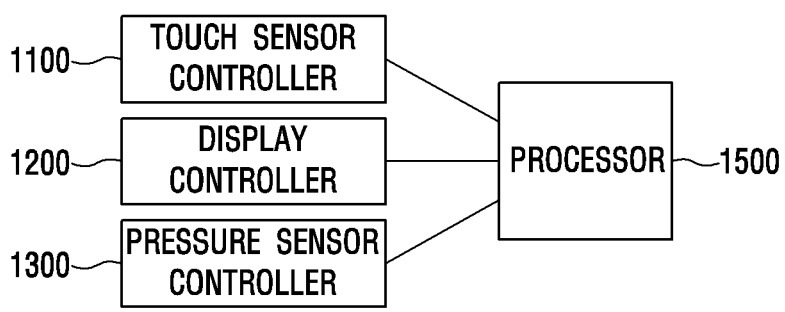
FIG. 2 shows a control block for controlling a touch position, a touch pressure and a display operation in the touch input device according to the embodiment of the present invention.

FIG. 2 shows a control block for controlling the touch position, a touch pressure and a display operation in the touch input device according to the embodiment of the present invention. In the touch input device 1000 configured to detect the touch pressure in addition to the display function and touch position detection, the control block may include the above-described touch sensor controller 1100 for detecting the touch position, a display controller 1200 for driving the display panel, and a pressure sensor controller 1300 for detecting the pressure. The display controller 1200 may include a control circuit which receives an input from an application processor (AP) or a central processing unit (CPU) on a main board for the operation of the touch input device 1000 and displays the contents that the user wants on the display panel 200A. The control circuit may be mounted on a display circuit board (hereafter, referred to as a display PCB). The control circuit may include a display panel control IC, a graphic controller IC, and a circuit required to operate other display panel 200A.

The pressure sensor controller 1300 for detecting the pressure through a pressure sensing unit may be configured similarly to the touch sensor controller 1100, and thus, may operate similarly to the touch sensor controller 1100. Specifically, as shown in FIGS. 1a and 1b, the pressure sensor controller 1300 may include the drive unit, the sensing unit, and the controller, and may detect a magnitude of the pressure by the sensing signal sensed by the sensing unit. Here, the pressure sensor controller 1300 may be mounted on the touch PCB on which the touch sensor controller 1100 has been mounted or may be mounted on the display PCB on which the display controller 1200 has been mounted.

According to the embodiment, the touch sensor controller 1100, the display controller 1200, and the pressure sensor controller 1300 may be included as different components in the touch input device 1000. For example, the touch sensor controller 1100, the display controller 1200, and the pressure sensor controller 1300 may be composed of different chips respectively. Here, a processor 1500 of the touch input device 1000 may function as a host processor for the touch sensor controller 1100, the display controller 1200, and the pressure sensor controller 1300.

The touch input device 1000 according to the embodiment of the present invention may include an electronic device including a display screen and/or a touch screen, such as a cell phone, a personal data assistant (PDA), a smartphone, a tablet personal computer (PC).

In order to manufacture such a thin and lightweight light-weighing touch input device 1000, the touch sensor controller 1100, the display controller 1200, and the pressure sensor controller 1300, which are, as described above, formed separately from each other, may be integrated into one or more configurations in accordance with the embodiment of the present invention. In addition to this, these controllers can be integrated into the processor 1500 respectively. Also, according to the embodiment of the present invention, the touch sensor 10 and/or the pressure sensing unit may be integrated into the display panel 200A.

In the touch input device 1000 according to the embodiment of the present invention, the touch sensor 10 for detecting the touch position may be positioned outside or inside the display panel 200A. The display panel 200A of the touch input device 1000 according to the embodiment of the present invention may be a display panel included in a liquid crystal display (LCD), a plasma display panel (PDP), an organic light emitting diode (OLED), etc. Accordingly, a user may perform the input operation by touching the touch surface while visually identifying an image displayed on the display panel.

Figure 3A:
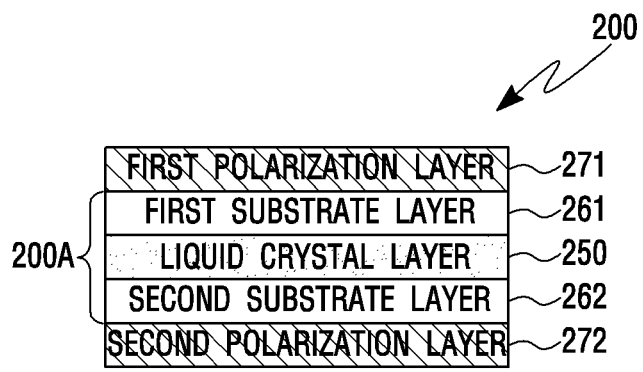
FIGS. 3a to 3b are conceptual views for describing a configuration of a display module in the touch input device according to the embodiment of the present invention.
Figure 3B:
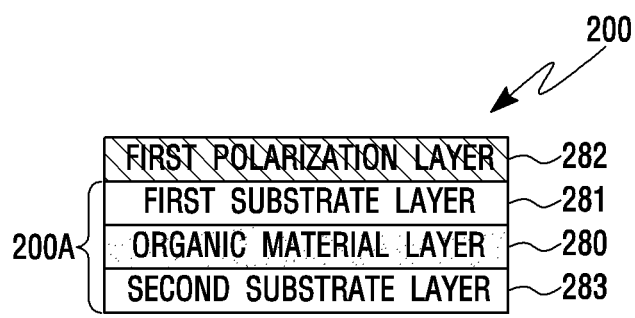

FIGS. 3a and 3b are conceptual views for describing a configuration of a display module 200 in the touch input device 1000 according to the embodiment of the present invention. First, the configuration of the display module 200 including the display panel 200A using an LCD panel will be described with reference to FIG. 3a.

As shown in FIG. 3a, the display module 200 may include the display panel 200A that is an LCD panel, a first polarization layer 271 disposed on the display panel 200A, and a second polarization layer 272 disposed under the display panel 200A. The display panel 200A that is an LCD panel may include a liquid crystal layer 250 including a liquid crystal cell, a first substrate layer 261 disposed on the liquid crystal layer 250, and a second substrate layer 262 disposed under the liquid crystal layer 250. Here, the first substrate layer 261 may be made of color filter glass, and the second substrate layer 262 may be made of TFT glass. Also, according to the embodiment, at least one of the first substrate layer 261 and the second substrate layer 262 may be made of a bendable material such as plastic. In FIG. 3a, the second substrate layer 262 may be comprised of various layers including a data line, a gate line, TFT, a common electrode, and a pixel electrode, etc. These electrical components may operate in such a manner as to generate a controlled electric field and orient liquid crystals located in the liquid crystal layer 250.

Next, the configuration of the display module 200 including the display panel 200A using an OLED panel will be described with reference to FIG. 3b.

As shown in FIG. 3b, the display module 200 may include the display panel 200A that is an OLED panel, and a first polarization layer 282 disposed on the display panel 200A. The display panel 200A that is an OLED panel may include an organic material layer 280 including an organic light-emitting diode (OLED), a first substrate layer 281 disposed on the organic material layer 280, and a second substrate layer 283 disposed under the organic material layer 280. Here, the first substrate layer 281 may be made of encapsulation glass, and the second substrate layer 283 may be made of TFT glass. Also, according to the embodiment, at least one of the first substrate layer 281 and the second substrate layer 283 may be made of a bendable material such as plastic. The OLED panel shown in FIG. 3b may include an electrode used to drive the display panel 200A, such as a gate line, a data line, a first power line (ELVDD), a second power line (ELVSS), etc. The organic light-emitting diode (OLED) panel is a self-light emitting display panel which uses a principle where, when current flows through a fluorescent or phosphorescent organic thin film and then electrons and electron holes are combined in the organic material layer, so that light is generated. The organic material constituting the light emitting layer determines the color of the light.

Specifically, the OLED uses a principle in which when an organic material is disposed on glass or plastic and electricity flows, and then the organic material emits light. That is, the principle is that electron holes and electrons are injected into the anode and cathode of the organic material respectively and are recombined in the light emitting layer, so that a high energy exciton is generated and the exciton releases the energy while falling down to a low energy state and then light with a particular wavelength is generated. Here, the color of the light is changed according to the organic material of the light emitting layer.

The OLED includes a line-driven passive-matrix organic light-emitting diode (PM-OLED) and an individual driven active-matrix organic light-emitting diode (AM-OLED) in accordance with the operating characteristics of a pixel constituting a pixel matrix. None of them require a backlight. Therefore, the OLED enables a very thin display module to be implemented, has a constant contrast ratio according to an angle and obtains a good color reproductivity depending on a temperature. Also, it is very economical in that non-driven pixel does not consume power.

In terms of operation, the PM-OLED emits light only during a scanning time at a high current, and the AM-OLED maintains a light emitting state only during a frame time at a low current. Therefore, the AM-OLED has a resolution higher than that of the PM-OLED and is advantageous for driving a large area display panel and consumes low power. Also, a thin film transistor (TFT) is embedded in the AM-OLED, and thus, each component can be individually controlled, so that it is easy to implement a delicate screen.

Also, the organic material layer 280 may include a hole injection layer (HIL), a hole transport layer (HTL), an electron injection layer (EIL), an electron transport layer (ETL), and an emission material layer (EML).

Briefly describing each of the layers, HIL injects electron holes and is made of a material such as CuPc, etc. HTL functions to move the injected electron holes and mainly is made of a material having a good hole mobility. Arylamine, TPD, and the like may be used as the HTL. The EIL and ETL inject and transport electrons. The injected electrons and electron holes are combined in the EML and emit light. The EML represents the color of the emitted light and is composed of a host determining the lifespan of the organic material and an impurity (dopant) determining the color sense and efficiency. This just describes the basic structure of the organic material layer 280 include in the OLED panel. The present invention is not limited to the layer structure or material, etc., of the organic material layer 280.

The organic material layer 280 is inserted between an anode (not shown) and a cathode (not shown). When the TFT becomes an on-state, a driving current is applied to the anode and the electron holes are injected, and the electrons are injected to the cathode. Then, the electron holes and electrons move to the organic material layer 280 and emit the light.

It will be apparent to a skilled person in the art that the LCD panel or the OLED panel may further include other structures so as to perform the display function and may be transformed.

The display module 200 of the touch input device 1000 according to the embodiment of the present invention may include the display panel 200A and a configuration for driving the display panel 200A. Specifically, when the display panel 200A is an LCD panel, the display module 200 may include a backlight unit (not shown) disposed under the second polarization layer 272 and may further include a display panel control IC for operation of the LCD panel, a graphic control IC, and other circuits.

In the touch input device 1000 according to the embodiment of the present invention, the touch sensor 10 for detecting the touch position may be positioned outside or inside the display module 200.

When the touch sensor 10 in the touch input device 1000 positioned outside the display module 200, the touch sensor panel may be disposed on the display module 200, and the touch sensor 10 may be included in the touch sensor panel. The touch surface of the touch input device 1000 may be the surface of the touch sensor panel.

When the touch sensor 10 in the touch input device 1000 positioned inside the display module 200, the touch sensor 10 may be configured to be positioned outside the display panel 200A. Specifically, the touch sensor 10 may be formed on the top surfaces of the first substrate layers 261 and 281. Here, the touch surface of the touch input device 1000 may be an outer surface of the display module 200 and may be the top surface or bottom surface in FIGS. 3 and 3b.

When the touch sensor 10 in the touch input device 1000 positioned inside the display module 200, at least a portion of the touch sensor 10 may be configured to be positioned inside the display panel 200A, and at least a portion of the remaining touch sensor 10 may be configured to be positioned outside the display panel 200A. For example, any one of the drive electrode TX and the receiving electrode RX, which constitute the touch sensor 10, may be configured to be positioned outside the display panel 200A, and the other may be configured to be positioned inside the display panel 200A. Specifically, any one of the drive electrode TX and the receiving electrode RX, which constitute the touch sensor 10, may be formed on the top surface of the top surfaces of the first substrate layers 261 and 281, and the other may be formed on the bottom surfaces of the first substrate layers 261 and 281 or may be formed on the top surfaces of the second substrate layers 262 and 283.

When the touch sensor 10 in the touch input device 1000 positioned inside the display module 200, the touch sensor 10 may be configured to be positioned inside the display panel 200A. Specifically, the touch sensor 10 may be formed on the bottom surfaces of the first substrate layers 261 and 281 or may be formed on the top surfaces of the second substrate layers 262 and 283.

When the touch sensor 10 is positioned inside the display panel 200A, an electrode for operation of the touch sensor may be additionally disposed. However, various configurations and/or electrodes positioned inside the display panel 200A may be used as the touch sensor 10 for sensing the touch. Specifically, when the display panel 200A is the LCD panel, at least any one of the electrodes included in the touch sensor 10 may include at least any one of a data line, a gate line, TFT, a common electrode (Vcom), and a pixel electrode. When the display panel 200A is the OLED panel, at least any one of the electrodes included in the touch sensor 10 may include at least any one of a data line, a gate line, a first power line (ELVDD), and a second power line (ELVSS).

Here, the touch sensor 10 may function as the drive electrode and the receiving electrode described in FIG. 1a and may detect the touch position in accordance with the mutual capacitance between the drive electrode and the receiving electrode. Also, the touch sensor 10 may function as the single electrode 30 described in FIG. 1b and may detect the touch position in accordance with the self-capacitance of each of the single electrodes 30. Here, if the electrode included in the touch sensor 10 is used to drive the display panel 200A, the touch sensor 10 may drive the display panel 200A in a first time interval and may detect the touch position in a second time interval different from the first time interval.

Hereafter, in order to detect the touch pressure in the touch input device according to the embodiment of the present invention, the following detailed description will be provided by taking an example of a case where a separate sensor which is different from the electrode used to detect the touch position and the electrode used to drive the display is disposed and used as the pressure sensing unit.

In the touch input device 1000 according to the embodiment of the present invention, by means of an adhesive like an optically clear adhesive (OCA), lamination may occur between a cover layer 100 on which the touch sensor for detecting the touch position has been formed and the display module 200 including the display panel 200A. As a result, the display color clarity, visibility and optical transmittance of the display module 200, which can be recognized through the touch surface of the touch sensor, can be improved.

FIGS. 4a to 4e show an example in which the pressure sensor is formed in the in the touch input device according to the embodiment of the present invention.

Figure 4A:
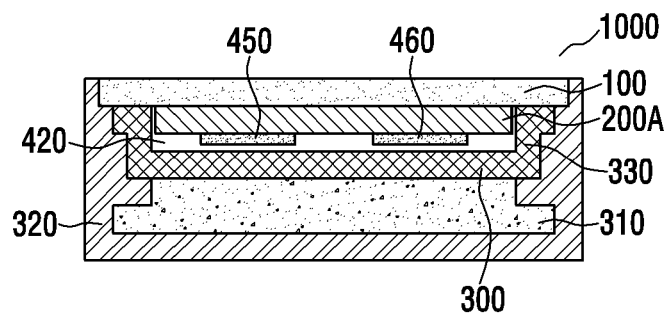
FIGS. 4a to 4e show an example in which a pressure sensor is formed in the in the touch input device according to the embodiment of the present invention.

In FIG. 4a and some of the following figures, it is shown that the display panel 200A is directly laminated on and attached to the cover layer 100. However, this is only for convenience of description. The display module 200 where the first polarization layers 271 and 282 is located on the display panel 200A may be laminated on and attached to the cover layer 100. When the LCD panel is the display panel 200A, the second polarization layer 272 and the backlight unit are omitted.

Figure 4B:
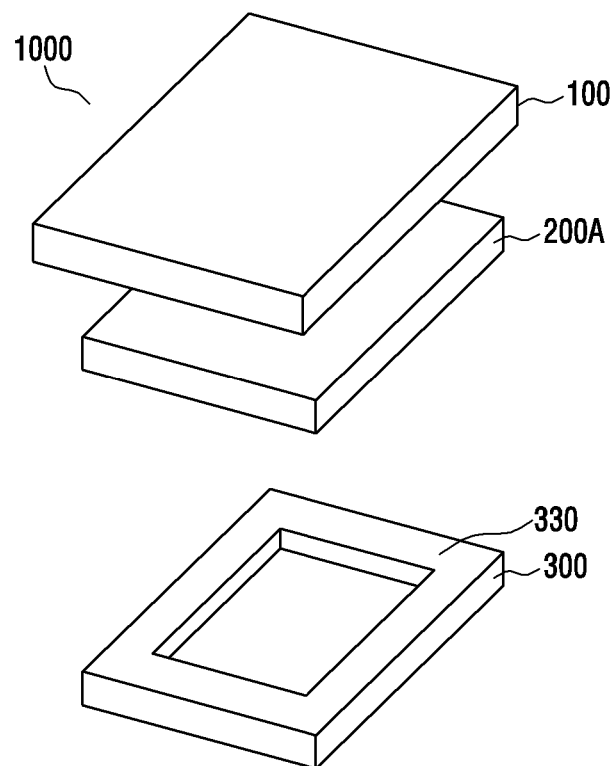

In the description with reference to FIGS. 4a to 4e, it is shown that as the touch input device 1000 according to the embodiment of the present invention, the cover layer 100 in which the touch sensor has been formed is laminated on and attached to the display module 200 shown in FIGS. 3a and 3b by means of an adhesive. However, the touch input device 1000 according to the embodiment of the present invention may include that the touch sensor 10 is disposed inside the display module 200 shown in FIGS. 3a and 3b. More specifically, while FIGS. 4a to 4b show that the cover layer 100 where the touch sensor 10 has been formed covers the display module 200 including the display panel 200A, the touch input device 1000 which includes the touch sensor 10 disposed inside the display module 200 and includes the display module 200 covered with the cover layer 100 like glass may be used as the embodiment of the present invention.

The touch input device 1000 according to the embodiment of the present invention may include an electronic device including the touch screen, for example, a cell phone, a personal data assistant (PDA), a smart phone, a tablet personal computer, an MP3 player, a laptop computer, etc.

In the touch input device 1000 according to the embodiment of the present invention, a substrate 300, together with an outermost housing 320 of the touch input device 1000, may function to surround a mounting space 310, etc., where the circuit board and/or battery for operation of the touch input device 1000 are placed. Here, the circuit board for operation of the touch input device 1000 may be a main board. A central processing unit (CPU), an application processor (AP) or the like may be mounted on the circuit board. Due to the substrate 300, the display module 200 is separated from the circuit board and/or battery for operation of the touch input device 1000. Due to the substrate 300, electrical noise generated from the display module 200 and noise generated from the circuit board can be blocked.

The touch sensor 10 or the cover layer 100 of the touch input device 1000 may be formed wider than the display module 200, the substrate 300, and the mounting space 310. As a result, the housing 320 may be formed such that the housing 320, together with the touch sensor 10, surrounds the display module 200, the substrate 300, and the circuit board.

The touch input device 1000 according to the embodiment of the present invention may detect the touch position through the touch sensor 10 and may detect the touch pressure by disposing a separate sensor which is different from the electrode used to detect the touch position and the electrode used to drive the display and by using the separate sensor as the pressure sensing unit. Here, the touch sensor 10 may be disposed inside or outside the display module 200.

Hereinafter, the components for detecting the pressure are collectively referred to as the pressure sensing unit. For example, the pressure sensing unit may include pressure sensors 450 and 460.

Also, the pressure sensing unit may be formed to further include, for example, a spacer layer 420 composed of an air gap. This will be described in detail with reference to FIGS. 4a to 4d.

According to the embodiment, the spacer layer 420 may be implemented by the air gap. According to the embodiment, the spacer layer 420 may be made of an impact absorbing material. According to the embodiment, the spacer layer 420 may be filled with a dielectric material. According to the embodiment, the spacer layer 420 may be made of a material having a restoring force by which the material contracts by applying the pressure and returns to its original shape by releasing the pressure. According to the embodiment, the spacer layer 420 may be made of elastic foam. Also, since the spacer layer is disposed under the display module 200, the spacer layer may be made of a transparent material or an opaque material.

Also, a reference potential layer may be disposed under the display module 200. Specifically, the reference potential layer may be formed on the substrate 300 disposed under the display module 200. Alternatively, the substrate 300 itself may serve as the reference potential layer. Also, the reference potential layer may be disposed on the cover (not shown) which is disposed on the substrate 300 and under the display module 200 and functions to protect the display module 200. Alternatively, the cover itself may serve as the reference potential layer. When a pressure is applied to the touch input device 1000, the display panel 200A is bent. Due to the bending of the display panel 200A, a distance between the reference potential layer and the pressure sensor 450 and 460 may be changed. Also, the spacer layer may be disposed between the reference potential layer and the pressure sensor 450 and 460. Specifically, the spacer layer may be disposed between the display module 200 and the substrate 300 where the reference potential layer has been disposed or between the display module 200 and the cover where the reference potential layer has been disposed.

Also, the reference potential layer may be disposed inside the display module 200. Specifically, the reference potential layer may be disposed on the top surfaces or bottom surfaces of the first substrate layers 261 and 281 of the display panel 200A or on the top surfaces or bottom surfaces of the second substrate layers 262 and 283. When a pressure is applied to the touch input device 1000, the display panel 200A is bent. Due to the bending of the display panel 200A, the distance between the reference potential layer and the pressure sensor 450 and 460 may be changed. Also, the spacer layer may be disposed between the reference potential layer and the pressure sensor 450 and 460. In the case of the touch input device 1000 shown in FIGS. 3a and 3b, the spacer layer may be disposed on or inside the display panel 200A.

Likewise, according to the embodiment, the spacer layer may be implemented by the air gap. According to the embodiment, the spacer layer may be made of an impact absorbing material. According to the embodiment, the spacer layer may be filled with a dielectric material. According to the embodiment, the spacer layer may be made of an elastic foam. Here, the elastic foam according to the embodiment has a flexibility that changes the shape thereof, for example, allows the elastic foam to be pressed when an impact is applied to the elastic foam, so that the elastic foam may not only serve to absorb the impact but also have the restoring force to provide the performance uniformity for the pressure detection. Also, since the spacer layer is disposed on or inside the display panel 200A, the spacer layer may be made of a transparent material. Here, the elastic foam according to the embodiment may include at least any one of polyurethane, polyester, polypropylene, and acrylic.

According to the embodiment, when the spacer layer is disposed inside the display module 200, the spacer layer may be the air gap which is included during the manufacture of the display panel 200A and/or the backlight unit. When the display panel 200A and/or the backlight unit includes one air gap, the one air gap may function as the spacer layer. When the display panel 200A and/or the backlight unit includes a plurality of the air gaps, the plurality of air gaps may collectively function as the spacer layer.

Hereafter, for the purpose of clearly distinguishing the electrodes 450 and 460 from the electrode included in the touch sensor 10, the sensors 450 and 460 for detecting the pressure are designated as pressure sensors 450 and 460. Here, since the pressure sensors 450 and 460 are disposed in the back side instead of in the front side of the display panel 200A, the pressure sensor 450 and 460 may be made of an opaque material as well as a transparent material. When the display panel 200A is the LCD panel, the light from the backlight unit must transmit through the pressure sensors 450 and 460. Therefore, the pressure sensors 450 and 460 may be made of a transparent material such as ITO.

Here, a frame 330 having a predetermined height may be formed along the border of the upper portion of the substrate 300 in order to maintain the spacer layer 420 in which the pressure sensor 450 and 460 are disposed. Here, the frame 330 may be bonded to the cover layer 100 by means of an adhesive tape (not shown). While FIG. 4b shows the frame 330 is formed on the entire border (e.g., four sides of the quadrangle) of the substrate 300, the frame 330 may be formed only on at least some (e.g., three sides of the quadrangle) of the border of the substrate 300. According to the embodiment, the frame 330 may be formed on the top surface of the substrate 300 may be integrally formed with the substrate 300 on the top surface of the substrate 300. In the embodiment of the present invention, the frame 330 may be made of an inelastic material. In the embodiment of the present invention, when a pressure is applied to the display panel 200A through the cover layer 100, the display panel 200A, together with the cover layer 100, may be bent. Therefore, the magnitude of the touch pressure can be detected even though the frame 330 is not transformed by the pressure.

Figure 4C:
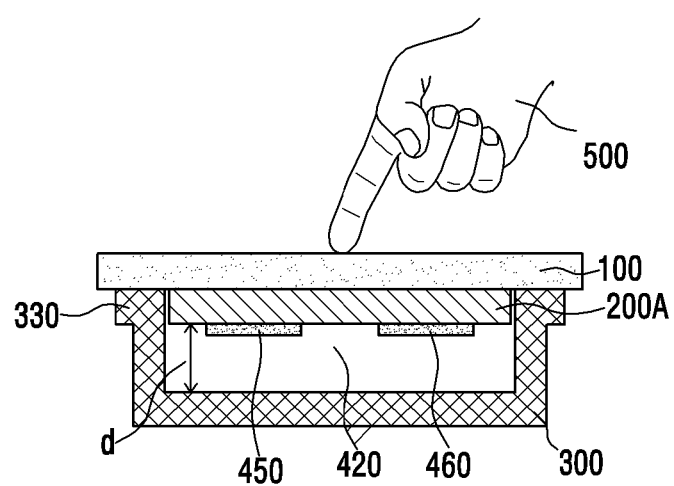

FIG. 4c is a cross sectional view of the touch input device including the pressure sensor according to the embodiment of the present invention. As shown in FIG. 4c, the pressure sensors 450 and 460 according to the embodiment of the present invention may be formed within the spacer layer 420 and on the bottom surface of the display panel 200A.

The pressure sensor for detecting the pressure may include the first sensor 450 and the second sensor 460. Here, any one of the first sensor 450 and the second sensor 460 may be a drive sensor, and the other may be a receiving sensor. A drive signal is applied to the drive sensor, and a sensing signal including information on electrical characteristics changing by applying the pressure may be obtained through the receiving sensor. For example, when a voltage is applied, a mutual capacitance may be generated between the first sensor 450 and the second sensor 460.

Figure 4D:
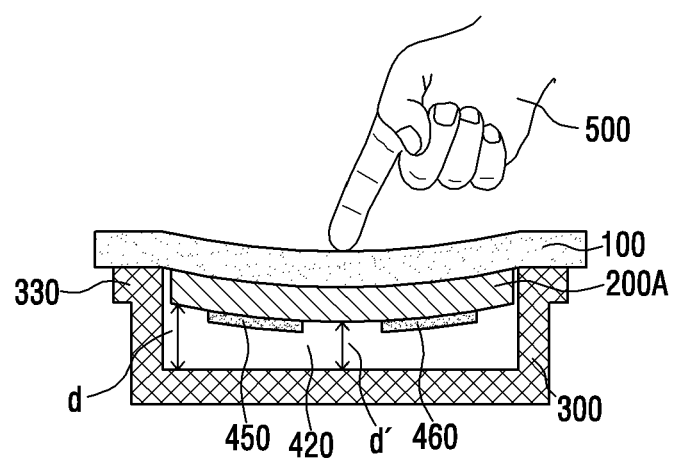

FIG. 4d is a cross sectional view when a pressure is applied to the touch input device 1000 shown in FIG. 4c.

The top surface of the substrate 300 may have a ground potential for shielding the noise. When a pressure is applied to the surface of the cover layer 100 by an object 500, the cover layer 100 and the display panel 200A may be bent or pressed. As a result, a distance "d" between the ground potential surface and the pressure sensors 450 and 460 may be decreased to "d'". In this case, due to the decrease of the distance "d", the fringing capacitance is absorbed in the top surface of the substrate 300, so that the mutual capacitance between the first sensor 450 and the second sensor 460 may be reduced. Therefore, the magnitude of the touch pressure can be calculated by obtaining the reduction amount of the mutual capacitance from the sensing signal obtained through the receiving sensor.

Although it has been described in FIG. 4d that the top surface of the substrate 300 has the ground potential, that is to say, is the reference potential layer, the reference potential layer may be disposed inside the display module 200. Here, when a pressure is applied to the surface of the cover layer 100 by the object 500, the cover layer 100 and the display panel 200A may be bent or pressed. As a result, a distance between the pressure sensors 450 and 460 and the reference potential layer disposed inside the display module 200 is changed. Therefore, the magnitude of the touch pressure can be calculated by obtaining the capacitance change amount from the sensing signal obtained through the receiving sensor.

In the touch input device 1000 according to the embodiment of the present invention, the display panel 200A may be bent or pressed by the touch applying the pressure. When the display panel 200A is bent or pressed according to the embodiment, a position showing the biggest transformation may not match the touch position. However, the display panel 200A may be shown to be bent at least at the touch position. For example, when the touch position approaches close to the border, edge, etc., of the display panel 200A, the most bent or pressed position of the display panel 200A may not match the touch position, however, the display panel 200A may be shown to be bent or pressed at least at the touch position.

In the state where the first sensor 450 and the second sensor 460 are formed in the same layer, each of the first sensor 450 and the second sensor 460 shown in FIGS. 4c and 4d may be, as shown in FIG. 9a, composed of a plurality of lozenge-shaped sensors. Here, the plurality of the first sensors 450 are connected to each other in the first axial direction, and the plurality of the second sensors 460 are connected to each other in the second axial direction orthogonal to the first axial direction. The lozenge-shaped sensors of at least one of the first sensor 450 and the second sensor 460 are connected to each other through a bridge, so that the first sensor 450 and the second sensor 460 may be insulated from each other. Also, here, the first sensor 450 and the second sensor 460 shown in FIGS. 5a to 5c may be composed of a sensor having a form shown in FIG. 9b.

In the foregoing, it is shown that the touch pressure is detected from the change of the mutual capacitance between the first sensor 450 and the second sensor 460. However, the pressure sensing unit may be configured to include only any one of the first sensor 450 and the second sensor 460. In this case, it is possible to detect the magnitude of the touch pressure by detecting the change of the capacitance between the one pressure sensor and a ground layer (the reference potential layer disposed inside the display module 200 or the substrate 300), that is to say, the change of the self-capacitance. Here, the drive signal is applied to the one pressure sensor, and the change of the self-capacitance between the pressure sensor and the ground layer can be detected by the pressure sensor.

For instance, in FIG. 4c, the pressure sensor may be configured to include only the first sensor 450. Here, the magnitude of the touch pressure can be detected by the change of the capacitance between the first sensor 450 and the substrate 300, which is caused by a distance change between the substrate 300 and the first sensor 450. Since the distance "d" is reduced with the increase of the touch pressure, the capacitance between the substrate 300 and the first sensor 450 may be increased with the increase of the touch pressure. Here, the pressure sensor should not necessary have a comb teeth shape or a trident shape, which is required to improve the detection accuracy of the mutual capacitance change amount. The pressure sensor may have a plate shape (e.g., quadrangular plate). Or, as shown in FIG. 9d, the plurality of the first sensors 450 may be disposed at a regular interval in the form of a grid.

Figure 4E:
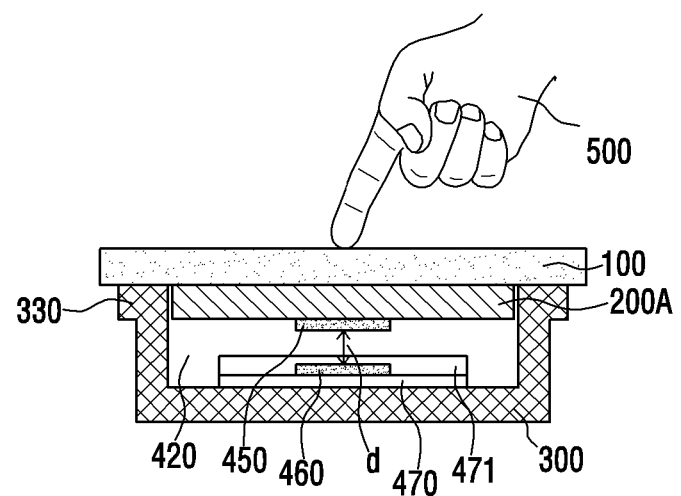

FIG. 4e shows that the pressure sensors 450 and 460 are formed within the spacer layer 420 and on the top surface of the substrate 300 and on the bottom surface of the display panel 200A. Here, the first sensor 450 may be formed on the bottom surface of the display panel 200A, and the second sensor 460 may be disposed on the top surface of the substrate 300 in the form of a sensor sheet in which the second sensor 460 is formed on a first insulation layer 470 and a second insulation layer 471 is formed on the second sensor 460.

When the object 500 applies a pressure to the surface of the cover layer 100, the cover layer 100 and the display panel 200A may be bent or pressed. As a result, a distance "d" between the first sensor 450 and the second sensor 460 may be reduced. In this case, the mutual capacitance between the first sensor 450 and the second sensor 460 may be increased with the reduction of the distance "d". Therefore, the magnitude of the touch pressure can be calculated by obtaining the increase amount of the mutual capacitance from the sensing signal obtained through the receiving sensor. Here, in FIG. 4e, since the first sensor 450 and the second sensor 460 are formed in different layers, the first sensor 450 and the second sensor 460 should not necessary have a comb teeth shape or a trident shape. Any one sensor of the first sensor 450 and the second sensor 460 may have a plate shape (e.g., quadrangular plate), and the other remaining plural sensors may be, as shown in FIG. 9d, disposed at a regular interval in the form of a grid.

Figure 5A:
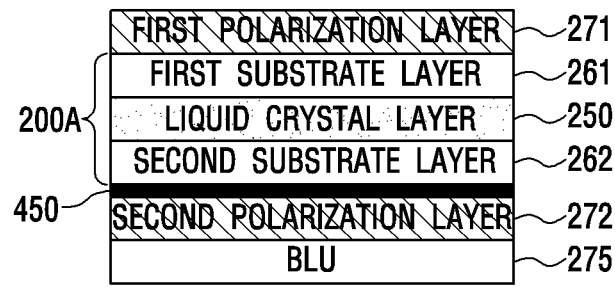
FIGS. 5a to 5c are cross sectional views showing an embodiment of the pressure sensor formed directly on various display panel of the touch input device according to the embodiment of the present invention.
Figure 5B:
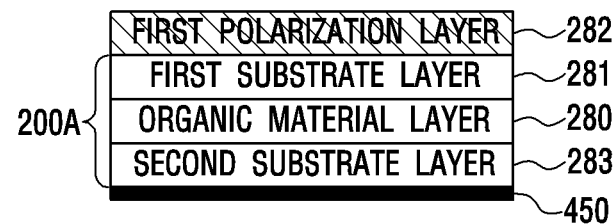
Figure 5C:
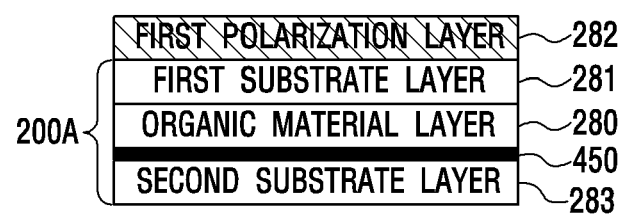

In the touch input device 1000 according to the embodiment of the present invention, the pressure sensors 450 and 460 may be directly formed on the display panel 200A. FIGS. 5a to 5c are cross sectional views showing an embodiment of the pressure sensor formed directly on various display panel of the touch input device according to the embodiment of the present invention.

First, FIG. 5a shows the pressure sensors 450 and 460 formed on the display panel 200A using the LCD panel. Specifically, as shown in FIG. 5a, the pressure sensors 450 and 460 may be formed on the bottom surface of the second substrate layer 262. Here, the pressure sensors 450 and 460 may be formed on the bottom surface of the second polarization layer 272. In detecting the touch pressure on the basis of the mutual capacitance change amount when a pressure is applied to the touch input device 1000, a drive signal is applied to the drive sensor, and an electrical signal including information on the capacitance which is changed by the distance change between the pressure sensors 450 and 460 and the reference potential layer (not shown) separated from the pressure sensors 450 and 460 is received from the receiving sensor. When the touch pressure is detected on the basis of the self-capacitance change amount, a drive signal is applied to the pressure sensors 450 and 460, and an electrical signal including information on the capacitance which is changed by the distance change between the pressure sensors 450 and 460 and the reference potential layer (not shown) separated from the pressure sensors 450 and 460 is received from the pressure sensors 450 and 460.

Next, FIG. 5b shows the pressure sensors 450 and 460 formed on the bottom surface of the display panel 200A using the OLED panel (in particular, AM-OLED panel). Specifically, the pressure sensors 450 and 460 may be formed on the bottom surface of the second substrate layer 283. Here, a method for detecting the pressure is the same as that described in FIG. 5a.

In the case of the OLED panel, since the organic material layer 280 emits light, the pressure sensors 450 and 460 which are formed on the bottom surface of the second substrate layer 283 disposed under the organic material layer 280 may be made of an opaque material. However, in this case, a pattern of the pressure sensors 450 and 460 formed on the bottom surface of the display panel 200A may be shown to the user. Therefore, for the purpose of directly forming the pressure sensors 450 and 460 on the bottom surface of the second substrate layer 283, a light shielding layer like black ink is disposed on the bottom surface of the second substrate layer 283, and then the pressure sensors 450 and 460 may be formed on the light shielding layer.

Also, FIG. 5b shows that the pressure sensors 450 and 460 are formed on the bottom surface of the second substrate layer 283. However, a third substrate layer may be disposed under the second substrate layer 283, and the pressure sensors 450 and 460 may be formed on the bottom surface of the third substrate layer. In particular, when the display panel 200A is a flexible OLED panel, the third substrate layer 285 which is not relatively easily bent may be disposed under the second substrate layer 283 because the display panel 200A composed of the first substrate layer 281, the organic material layer 280, and the second substrate layer 283 is very thin and easily bent. Here, the light shielding layer may be disposed under the third substrate layer 285, and a detailed description thereof will be provided below. In another embodiment of the present invention, a substrate having a function of shielding light such as a substrate colored black may be used as the third substrate layer 285. As such, when the third substrate layer has the light shielding function, the pattern of the pressure sensor 450 formed under the display panel 200A is not visible to the user even if a separate light shielding layer is not disposed.

Next, FIG. 5c shows the pressure sensor 450 formed inside the display panel 200A using the OLED panel. Specifically, the pressure sensor 450 may be formed on the top surface of the second substrate layer 283. Here, a method for detecting the pressure is the same as that described in FIG. 5a.

Also, although the display panel 200A using the OLED panel has been described by taking an example thereof with reference to FIG. 5c, it is possible that the pressure sensor 450 is formed on the top surface of the second substrate layer 262 of the display panel 200A using the LCD panel.

Also, although it has been described in FIGS. 5a to 5c that the pressure sensor 450 is formed on the top surfaces or bottom surfaces of the second substrate layers 262 and 283, it is possible that the pressure sensor 450 is formed on the top surfaces or bottom surfaces of the first substrate layers 261 and 281.

Next, as described above, when, particularly, the pressure sensor 450 is formed on the bottom surface of the display panel 200A, which is the OLED panel, according to the embodiment of FIG. 5b, the organic material layer 280 emits light. Therefore, when the pressure sensor 450 which is formed on the bottom surface of the second substrate layer 283 disposed under the organic material layer 280 is made of an opaque material, the pattern of the pressure sensor 450 formed on the bottom surface of the display panel 200A is visible to the user. There is a need to arrange a separate light shielding layer in order that the pattern of the pressure sensor 450 is not visible.

Hereinafter, FIGS. 6a to 6f show the shape of the display panel 200A due to the arrangement of the light shielding layer.

Figure 6A:
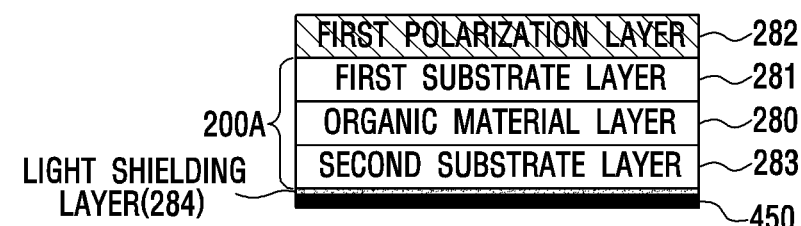
FIGS. 6a to 6f are cross sectional views of the touch input device, which shows the arrangement relationship between the pressure sensor and a light shielding layer according to the embodiment of the present invention.

According to the embodiment of the present invention, as described in FIG. 6a, after the light shielding layer 284, for example, black ink, is disposed under the second substrate layer 283, the pressure sensor 450 may be formed on the bottom surface of the light shielding layer 284.

Figure 6B:
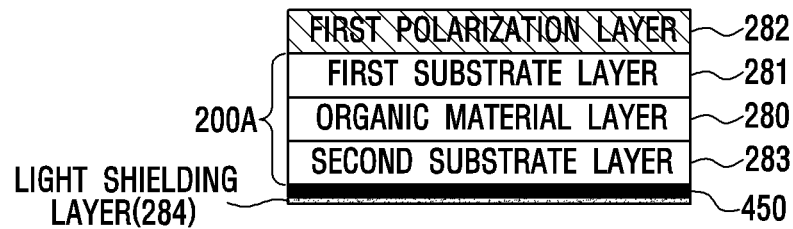

Further, according to another embodiment of the present invention, as described in FIG. 6b, after the pressure sensor 450 is first formed in direct contact with the bottom surface of the second substrate layer 283, the light shielding layer 284 may be disposed under the second substrate layer 283 on which the pressure sensor 450 has been formed.

Figure 6C:
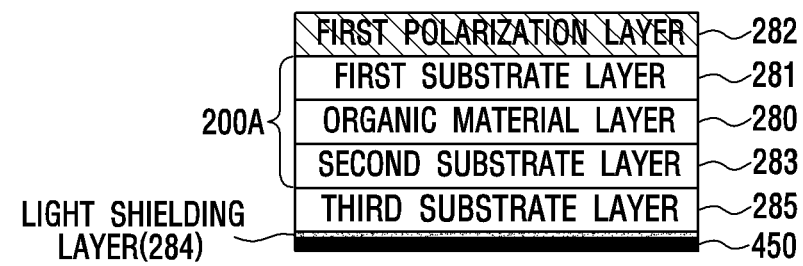

According to another embodiment of the present invention, as described in FIG. 6c, the third substrate layer 285 may be disposed under the second substrate layer 283 of the display panel 200A. Here, after the light shielding layer 284, for example, black ink, is disposed under the third substrate layer 285, the pressure sensor 450 may be formed on the bottom surface of the light shielding layer 284.

Figure 6D:
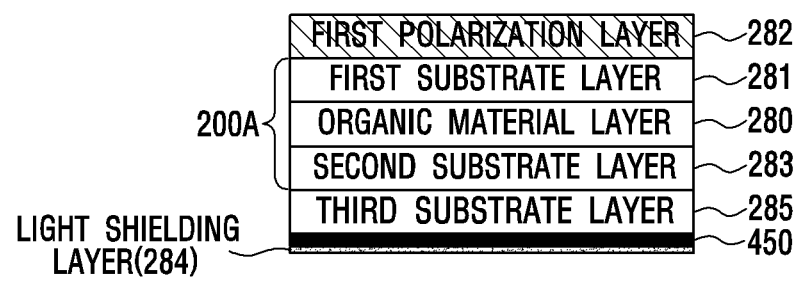

Also, according to another embodiment of the present invention, as described in FIG. 6d, the third substrate layer 285 may be disposed under the second substrate layer 283 of the display panel 200A. Here, after the pressure sensor 450 is first formed in direct contact with the bottom surface of the third substrate layer 285, the light shielding layer 284 may be disposed under the third substrate layer 285 on which the pressure sensor 450 has been formed.

Figure 6E:
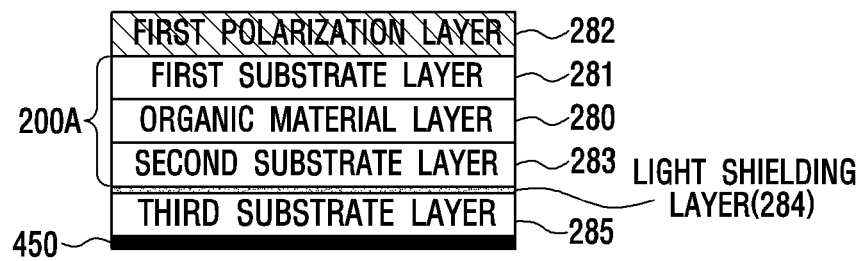

Also, according to another embodiment of the present invention, as described in FIG. 6e, the third substrate layer 285 may be disposed under the second substrate layer 283 of the display panel 200A. Here, after the pressure sensor 450 is formed in direct contact with the bottom surface of the third substrate layer 285, the light shielding layer 284 may be disposed between the second substrate layer 283 and the third substrate layer 285.

Figure 6F:
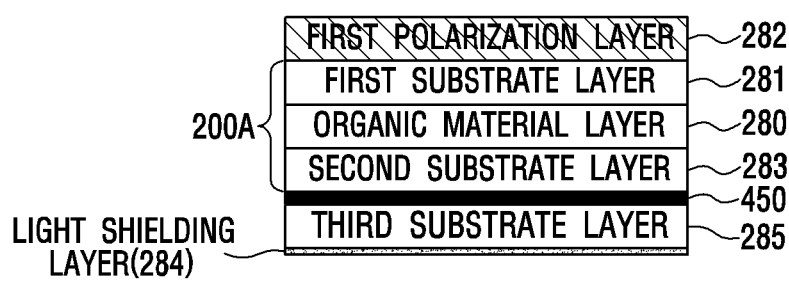

Lastly, according to another embodiment of the present invention, as described in FIG. 6f, the third substrate layer 285 may be disposed under the second substrate layer 283 of the display panel 200A. Here, the light shielding layer 284 may be disposed under the third substrate layer 285, and the pressure sensor 450 may be disposed between the second substrate layer 283 and the third substrate layer 285.

In the above six embodiments, the light shielding layer may include a black film, a black double adhesive tape (ADT), or a black elastic material which absorbs the impact on the touch input device as well as black ink. Here, the elastic material (or elastic foam) according to the embodiment has a flexibility that changes the shape thereof, for example, allows the elastic foam to be pressed when the impact is applied to the elastic foam, so that the elastic foam may not only serve to absorb the impact but also have the restoring force to provide the performance uniformity for the pressure detection. For example, the elastic foam may include at least any one of polyurethane, polyester, polypropylene, and acrylic.

The "black" according to the embodiment of the present invention may mean a complete black without light reflection or may mean a black having brightness and saturation, either or both of which are different from those of the complete black within a range of a predetermined threshold. For example, in the former case, the black may mean a complete 100% black, and in the latter case, the black may mean a black having brightness and saturation, either or both of which are different from those of the complete black within a range of a predetermined threshold (e.g., a range of 30%). In the latter case, even if the light shielding layer 284 has only the brightness or saturation of about 70% black, the pressure sensor 450 can be shielded from the light. In other words, the range of a predetermined threshold may mean a range capable of shielding the pressure sensor 450 from the light.

Next, as described in FIGS. 6c to 6f, in particular, when the display panel 200A according to the embodiment of the present invention is the flexible OLED panel, the third substrate layer 285 which is not relatively easily bent may be disposed under the second substrate layer 283 because the display panel 200A composed of the first substrate layer 281, the organic material layer 280, and the second substrate layer 283 is very thin and easily bent.

The flexible OLED panel on which the third substrate layer 285 is disposed and a manufacturing process thereof will be described in detail with reference to the following FIGS. 7, 8a, and 8b.

Figure 7:
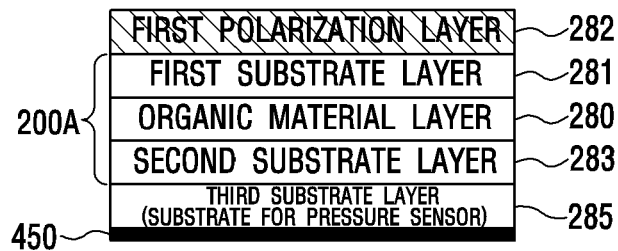
FIG. 7 is a cross sectional view showing the structure of a flexible display according to the embodiment of the present invention.

As shown in FIG. 7, the flexible OLED panel 200A according to the embodiment of the present invention may be composed of the first substrate layer 281, the organic material layer 280, and the second substrate layer 283. The third substrate layer 285 on which the pressure sensor 450 has been formed may be disposed under the second substrate layer 283.

Meanwhile, the respective substrate layers 281, 283, and 285 and the organic material layer 280 included in the flexible OLED panel 200A shown in FIG. 7 may be cut by cutting release process. A method for manufacturing the touch input device by the cutting release process will be described with reference to FIG. 8.

The method for manufacturing the touch input device according to the embodiment of the present invention may include a display forming step (1), a pressure sensor forming step (2), and an adhering step (3). Specifically, the display forming step (1) may include, as shown in FIG. 8a, forming the display panel 200A (hereinafter, it is premised that the display panel 200A is the flexible display.) for a plurality of display devices on one carrier substrate, cutting the formed flexible display 200A into individual pieces, and separating the cut flexible display 200A from the carrier substrate. According to the embodiment of the present invention, the carrier substrate may be made of carrier glass. Also, the pressure sensor forming step (2) may include forming a pressure sensor for the plurality of display devices on the third substrate layer 285 (hereinafter, it is premised that the third substrate layer is a substrate for the pressure sensor.) and cutting the substrate 285 for the pressure sensor, on which the pressure sensor has been formed, into individual pieces. Lastly, the adhering step (3) may include adhering the flexible display 200A which has been separated into individual pieces in the step (1) to the substrate 285 for the pressure sensor, which has been cut into individual pieces in the step (2).

Here, the (1), (2), and (3) do not mean a process sequence. The steps (1) and (2) can be independently performed. That is, after the display forming step (1) is performed first, the pressure sensor forming step (2) may be performed. Alternatively, after the pressure sensor forming step (2) is performed, the display forming step (1) may be performed. Alternatively the steps (1) and (2) may be performed at the same time.

Meanwhile, the display forming step (1) shown in FIG. 8a will be described in detail as follows. First, carrier substrate polyimide is coated on the carrier substrate and cured, and then the second substrate layer 283 can be formed (see (a) to (d)). For example, the second substrate layer 283 can be formed by low temperature polycrystalline silicon (LTPS) process which forms poly-Si TFT at a low temperature (see (d)). The organic material layer 280 can be formed on the second substrate layer 283. For example, R, G, B luminescent materials are patterned on each pixel by using fine metal mask (FMM) deposition process, and then the organic material layer 280 can be formed (see (e)). After the organic material layer 280 is formed, the first substrate layer 281 is formed on the organic material layer 280 (see (f)). The first substrate layer 281 may be made of encapsulating film.

After the flexible display 200A including the first substrate layer 281, the organic material layer 280, and the second substrate layer 283 which have been formed through the above-described process is cut into individual pieces (see (g)), the cut flexible display is separated from the carrier substrate by irradiating laser. The display forming step (1) is performed accordingly (see (h)).

Meanwhile, the touch input device shown in FIG. 7 may also include the above-described light shielding layer for shielding the pressure sensor from the light.

For example, after the process including the above-described display forming step (1), the pressure sensor forming step (2), and the adhering step (3) is performed, the light shielding layer 284 for shielding the pressure sensor 450 from the light may be disposed under the third substrate layer 285 on which the pressure sensor 450 has been formed. This light shielding layer 284 may have the same properties as those described in FIG. 6d.

Meanwhile, the pressure sensor 450 which is used in the touch input device according to the embodiment of the present invention and is capable of sensing the touch pressure may include a pressure electrode or a strain gauge. Also, the display module is bent according to the touch pressure on the touch input device, and the touch pressure can be detected based on the electrical characteristics of the pressure sensor 450 due to the bending.

Figure 10:
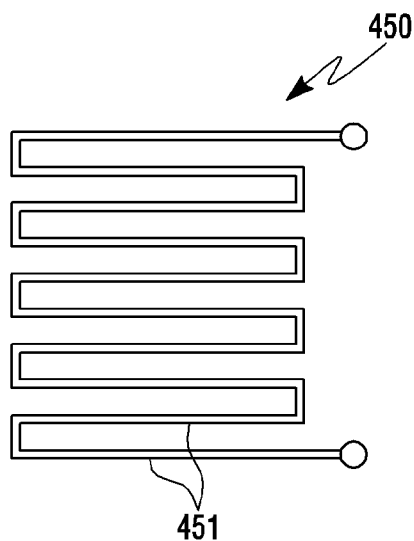
FIG. 10 is a view showing that the pressure sensor according to the embodiment of the present invention is a strain gauge.

When the pressure sensor 450 is the pressure electrode, the touch input device may include the reference potential layer (e.g., the substrate 300) formed at a predetermined distance apart from the pressure electrode and is able to detect the touch pressure on the basis of the capacitance that is changed according to the distance between the pressure electrode and the reference potential layer. In the meantime, when the pressure sensor 450 is the strain gauge shown in FIG. 10, the touch pressure can be detected based on the change of the resistance value of the strain gauge due to the touch pressure.

Figure 8A:
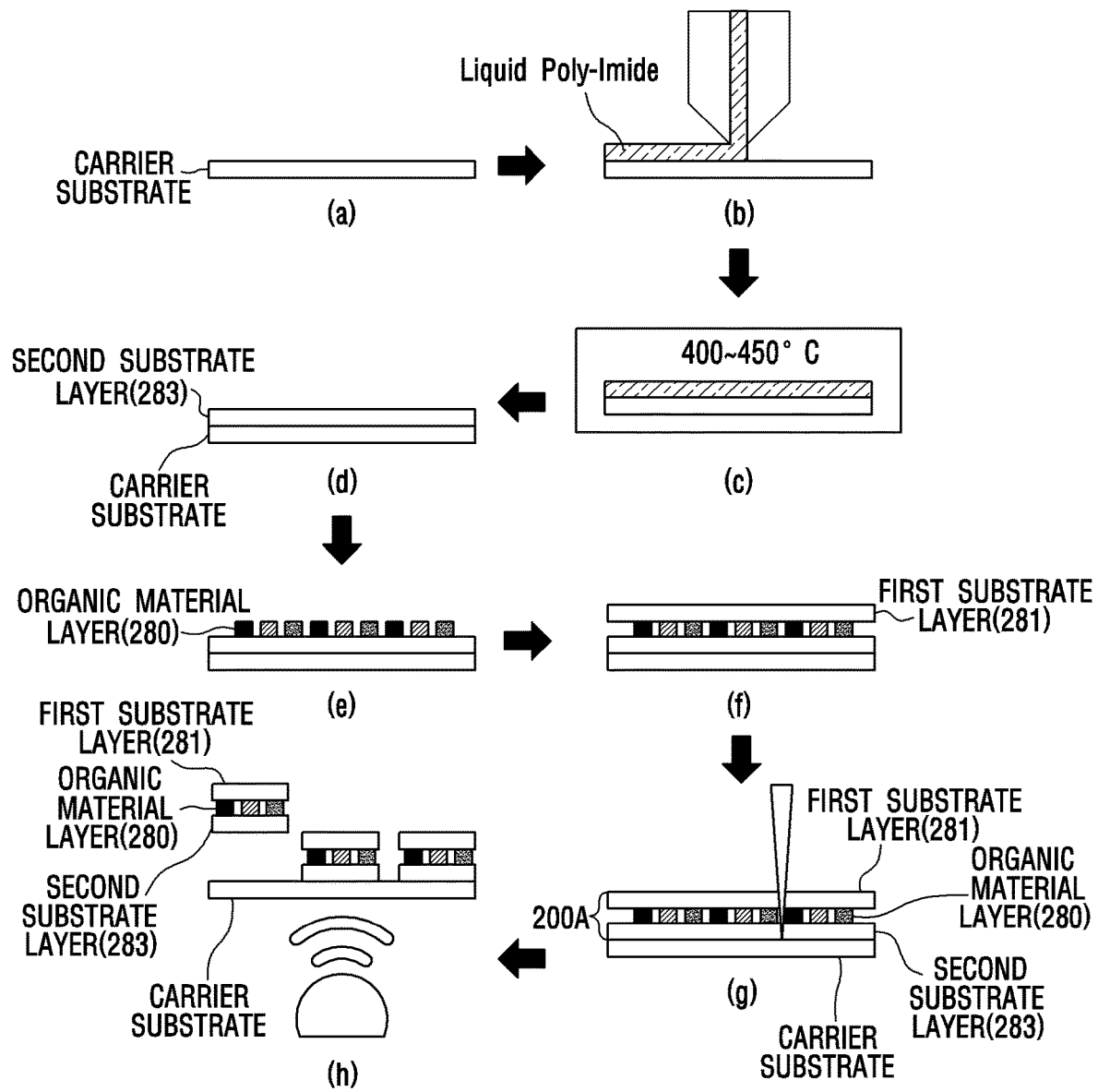
FIGS. 8*a* and 8*b* are views showing a schematized process for forming the flexible display according to FIG. 7.
Figure 8B:
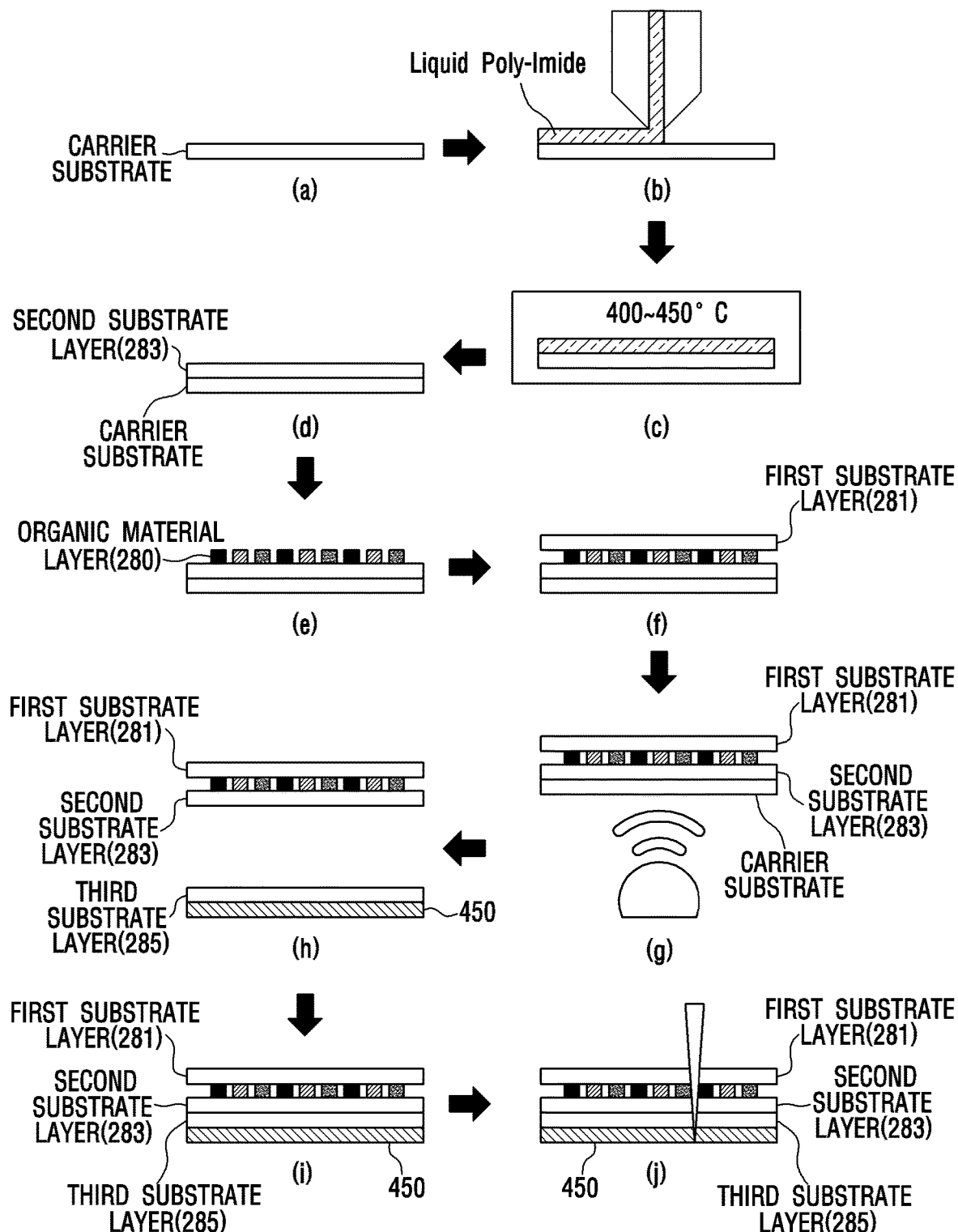

Meanwhile, as shown in FIG. 8b, the touch input device can be manufactured by another embodiment of the present invention.

The processes (a) to (f) are the same as that described in FIG. 8a. By the processes (a) to (f), the flexible display 200A for the plurality of display devices can be formed on one sheet of a carrier substrate (see (f)). Then, the flexible display 200A can be separated from the carrier substrate by irradiating laser (see (g)). Also, separately from this, the pressure sensor 450 for the plurality of display devices can be formed on one substrate for the pressure sensor (third substrate layer 285 (see (h)). After the flexible display 200A separated by the process (g) is adhered to the substrate 285 for the pressure sensor on which the pressure sensor 450 has been formed by the process (h) (see (i)), the substrate 285 for the pressure sensor and the flexible display 200A which have been adhered to each other are cut into individual pieces (see (j)), so that the touch input device shown in FIG. 7 can be finally manufactured.

Although the embodiment of FIG. 8b has described the step (1) of separating the manufactured flexible display 200A and the step (2) of forming the pressure sensor 450 on the substrate 285 for the pressure sensor, this does not mean a process sequence. That is, after the step (1) is performed first, the step (2) may be performed. Alternatively, after the step (2) is performed, the step (1) may be performed. Alternatively the steps (1) and (2) may be performed at the same time.

Meanwhile, the touch input device shown in FIG. 7 may also include the above-described light shielding layer for shielding the pressure sensor from the light.

For example, in the touch input device manufactured by the processes (a) to (j) described in FIG. 8b, the light shielding layer 284 for shielding the pressure sensor 450 from the light may be disposed under the third substrate layer 285 on which the pressure sensor 450 has been formed. This light shielding layer 284 may have the same properties as those described in FIG. 6d.

Meanwhile, various methods for forming the pressure sensor 450 on the third substrate layer 285 will be described below.

For reference, below-described various methods for forming the pressure sensor 450 on the third substrate layer 285 can be also applied in the same manner as or a similar manner to a case where the pressure sensor 450 is formed on the second substrate layer 283.

The method for forming the pressure sensor 450 on the third substrate layer 285 includes Gravure printing method (or roller printing method).

The Gravure printing method includes a Gravure offset printing method and a Reverse offset printing method. The Gravure offset printing method includes a roll type printing method and a sheet type printing method. Hereafter, the roll type printing method and the sheet type printing method which are included in the Gravure offset printing method, and the Reverse offset printing method will be described in turn with reference to the drawings.

Figure 11:
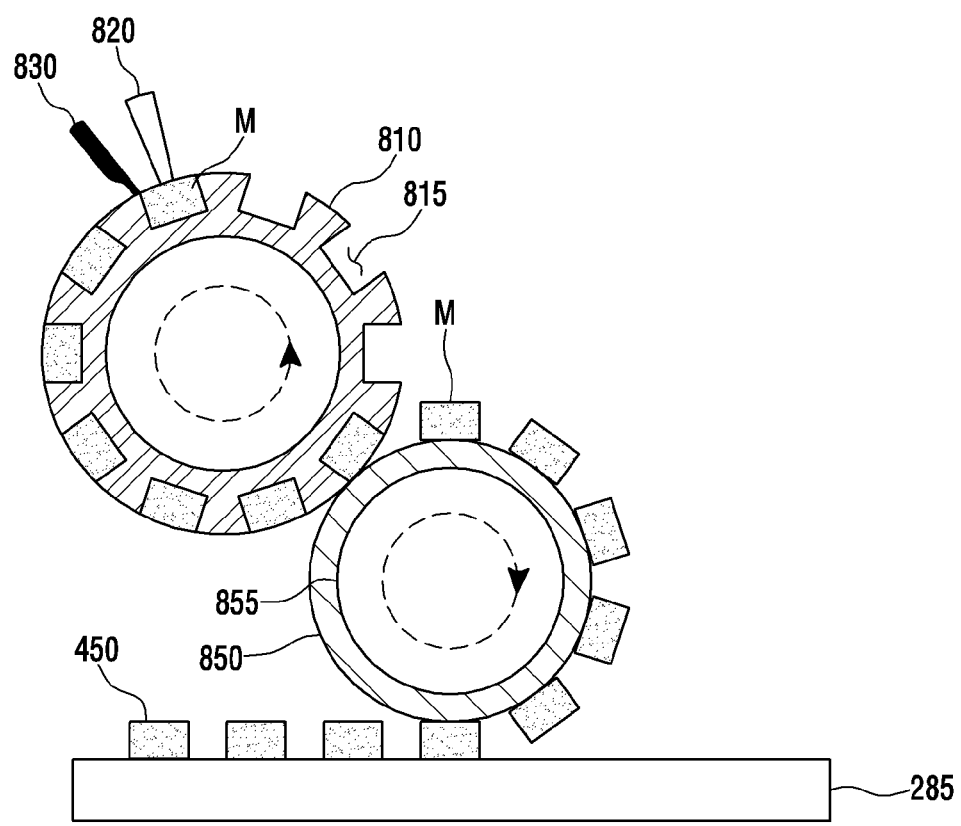
FIGS. 11 to 17 are views for describing various methods for forming the pressure sensor on a third substrate layer according to the embodiment of the present invention.

FIG. 11 is a view for describing a method for forming the pressure sensor 450 on the third substrate layer 285 by using a roll-type printing method.

Referring to FIG. 11, a pressure sensor constituent material is injected into a groove 815 formed in a Gravure roll 810 by using an injection unit 820. Here, the pressure sensor constituent material is filled in the groove 815 by using a blade 830. Here, the shape of the groove 815 corresponds to the shape of the pressure sensor 450 to be printed on the bottom surface of the inverted third substrate layer 285. The blade 830 functions to remove the excess amount of the pressure sensor constituent material overflowing the groove 815 and to push the pressure sensor constituent material into the groove 815. The injection unit 820 and the blade 830 are fixed and mounted around the Gravure roll 810. The Gravure roll 810 rotates counterclockwise.

The pressure sensor pattern M filled in the groove 815 of the Gravure roll 810 is transferred to a blanket 855 of a transfer roll 850 by rotating the Gravure roll 810. The rotation direction of the transfer roll 850 is opposite to the rotation direction of the Gravure roll 810. The blanket 855 may be made of a resin having a predetermined viscosity, particularly, silicon-based resin.

The transfer roll 850 is rotated and the pressure sensor pattern M transferred to the blanket 855 of the transfer roll 850 is transferred to the third substrate layer 285. As a result, the pressure sensor 450 may be formed on the bottom surface of the inverted third substrate layer 285.

Figure 12:
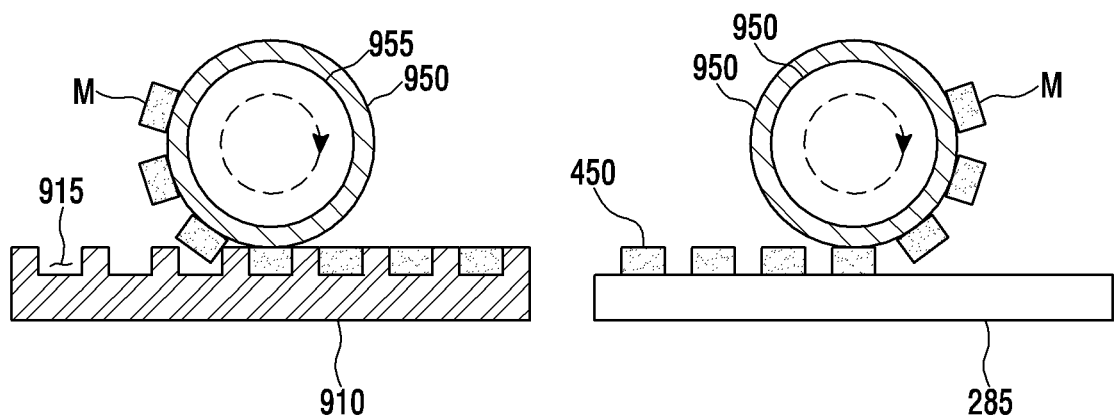
Figure 13:
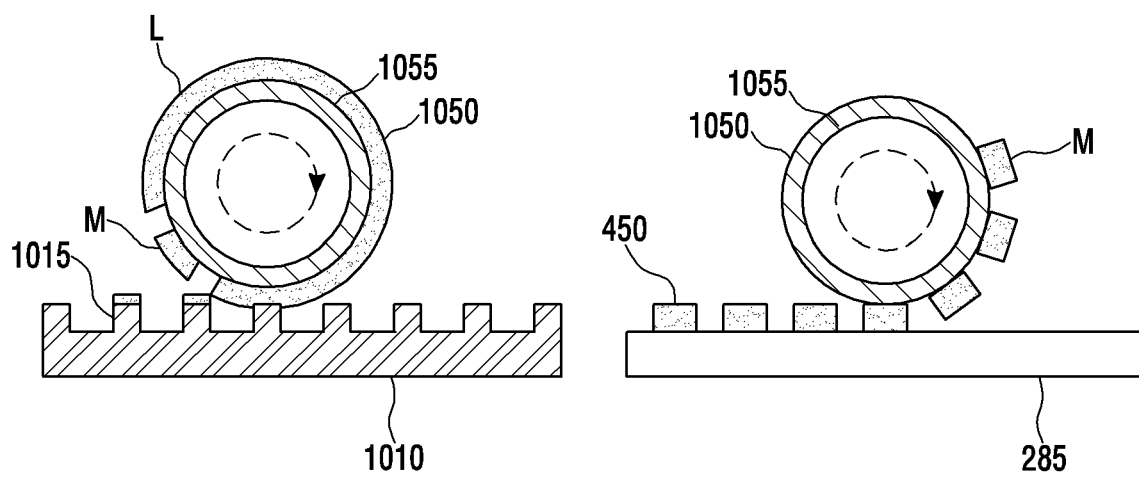

The roll type printing method shown in FIG. 11 has a better productivity than those of the methods shown in FIGS. 12 and 13, and thus, is advantageous for forming the pressure sensor having a simple shape such as a stripe-shaped pressure sensor or a mesh-shaped pressure sensor.

FIG. 12 is a view for describing a method for forming the pressure sensor 450 on the third substrate layer 285 by using the sheet type printing method.

Referring to FIG. 12, the pressure sensor constituent material is injected into a groove 915 of a Cliche plate 910, and the pressure sensor pattern M is formed in the groove 915.

A transfer roll 950 including a blanket 955 is rotated on the Cliche plate 910, and the pressure sensor pattern M is transferred to the blanket 955. Here, the transfer roll 950 is only rotated in a fixed state and the Cliche plate 910 can move under the transfer roll 950. Alternatively, the Cliche plate 910 is fixed and the transfer roll 950 can move with the rotation on the Cliche plate 910. The shape of the groove 915 corresponds to the shape of the pressure sensor 450 to be printed on the bottom surface of the inverted third substrate layer 285. The blanket 955 may be made of a resin having a predetermined viscosity, particularly, silicon-based resin.

When the pressure sensor pattern M is transferred to the blanket 955 of the transfer roll 950, the transfer roll 950 is rotated on the third substrate layer 285 and the pressure sensor pattern M is transferred to the bottom surface of the third substrate layer 285. As a result, the pressure sensor 450 can be formed on the bottom surface of the inverted third substrate layer 285. Here, the transfer roll 950 is only rotated in a fixed state and the third substrate layer 285 can move under the transfer roll 950. Alternatively, the third substrate layer 285 is fixed and the transfer roll 950 can move with the rotation on the third substrate layer 285.

FIG. 13 is a view for describing a method for forming the pressure sensor 450 on the third substrate layer 285 by using the reverse offset printing method.

Referring to FIG. 13, a transfer roll 1050 including a blanket 1055 is rotated on a Cliche plate 1010 including a protrusion 1015, and the pressure sensor pattern M is processed from a pressure sensor constituent material layer L coated on the entire outer surface of the blanket 1055. A portion of the pressure sensor constituent material layer L coated on the entire outer surface of the blanket 1055, which contacts the protrusion 1015, is transferred to the protrusion 1015 and the other portions, which do not contact the protrusion 1015, remain in the blanket 1055 as they are. Therefore, a predetermined pressure sensor pattern M of which the portions has been removed by the protrusion 1015 may be formed on the blanket 1055. Here, the transfer roll 1050 is only rotated in a fixed state and the Cliche plate 1010 can move under the transfer roll 1050. Alternatively, the Cliche plate 1010 is fixed and the transfer roll 1050 can move with the rotation on the Cliche plate 1010. The shape of the protrusion 1015 corresponds to the shape of the pressure sensor 450 to be printed on the bottom surface of the inverted third substrate layer 285. The blanket 1055 may be made of a resin having a predetermined viscosity, particularly, silicon-based resin.

When the pressure sensor pattern M is processed on the blanket 1055 of the transfer roll 1050, the transfer roll 1050 is rotated on the third substrate layer 285, and the pressure sensor pattern M is transferred to the bottom surface of the third substrate layer 285. As a result, the pressure sensor 450 can be formed on the bottom surface of the inverted third substrate layer 285. Here, the transfer roll 1050 is only rotated in a fixed state and the third substrate layer 285 can move under the transfer roll 1050. Alternatively, the third substrate layer 285 is fixed and the transfer roll 1050 can move with the rotation on the third substrate layer 285.

The reverse offset printing method is advantageous for forming the large area pressure sensor.

Through use of the Gravure printing method shown in FIGS. 11 to 13, the pressure sensor 450 can be directly printed and formed on the third substrate layer 285. Although the Gravure printing method has a somewhat lower resolution than the resolution of the above-described photolithography, etching resist method, and etching paste method, the pressure sensor formation process in the Gravure printing method is simpler than those of the above-described methods, and the Gravure printing method has a better productivity.

Also, the pressure sensor 450 may be formed on the third substrate layer 285 by the inkjet printing method.

The inkjet printing method means that a droplet (diameter less than 30 μm), i.e., the constituent material of the pressure sensor 450 is discharged and then the pressure sensor 450 is patterned on the third substrate layer 285.

The inkjet printing method is suitable for implementing a complicated shape in a small volume in a non-contact manner. The inkjet printing method has a simple process, a reduced facility cost, and a reduced manufacturing cost. The inkjet printing method has a low environmental load and does not waste raw material because the material is accumulated at a desired pattern position and thus there is no material loss in principle. Also, like photolithography, the inkjet printing method does not require a process such as development and etching, etc., so that the characteristics of the substrate or material are not degraded by chemical effects. Also, since the inkjet printing method is performed in a non-contact manner, devices are not damaged by contact. A substrate having unevenness can be also patterned. When the printing is performed in an on-demand manner, the pattern shape can be directly edited and changed by a computer.

The inkjet printing method is divided into a continuous manner in which the droplet is continuously discharged and an on-demand manner in which the droplet is selectively discharged. The continuous manner is mainly used in low resolution marking because the continuous manner generally requires large devices and has low print quality, so that the continuous manner is not suitable for colorization. The on-demand manner is used for high resolution patterning.

The on-demand inkjet printing method includes a piezo method and a bubble jet method (thermal method). In the piezo method, the volume is changed by replacing an ink chamber with a piezoelectric element (which is deformed when a voltage is applied), and when a pressure is applied to the ink within the ink chamber, the ink is discharged through a nozzle. In the bubble jet method, bubbles are instantaneously generated by applying heat to the ink, and then the ink is discharged by the pressure. The bubble jet method is the most suitable for an office because it is easy to miniaturize and densify the device and the cost of the head is low. However, the head has a short durability life due to the heat application and the available ink is limited because the effect of the boiling point of solvent or heat damage to the ink material is inevitable. In comparison with this, in the piezo method, the densification and head cost are worse than those of the bubble jet method. However, the piezo method has an excellent durability life of the head and excellent flexibility of the ink because no heat is applied to the ink. Therefore, the piezo method is more suitable for commercial printing, industrial printing, and device manufacture as well as offices.

Figure 14:
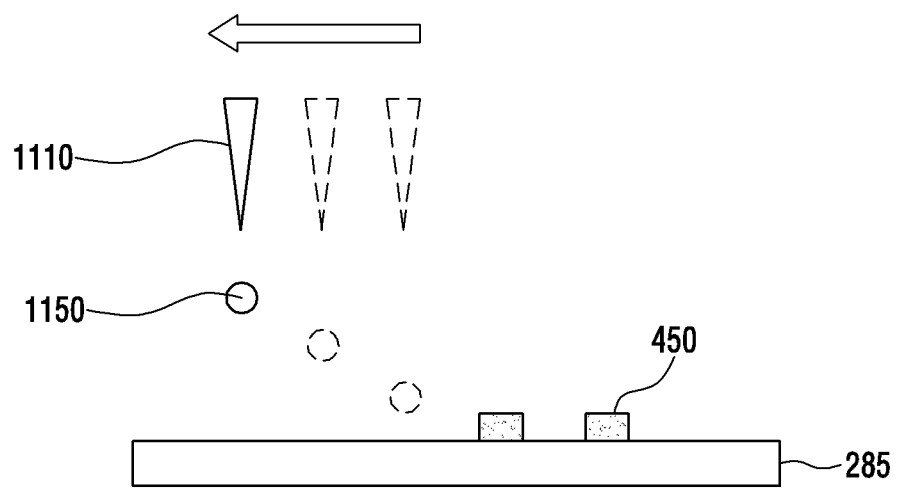

FIG. 14 is a view for describing a method for forming the pressure sensor 450 on the third substrate layer 285 by using the inkjet printing method.

Referring to FIG. 14, a fine droplet 1150 discharged through a nozzle 1110 flows in the air and is attached to the surface of the third substrate layer 285, and the solvent is dried and a solid component is fixed, so that the pressure sensor 450 is formed.

The size of the droplet 1150 is several to scores of pl and the diameter of the droplet 1150 is about 10 μm. The droplet 1150 collides with and is attached to one side of the third substrate layer 285 and then forms a predetermined pattern. The key factor for determining the resolution of the formed pattern is the size and wettability of the droplet 1150. The droplet 1150 dropped onto the third substrate layer 285 spreads on the third substrate layer 285 in a two dimensional way and finally becomes the pressure sensor 450 having a size larger than that of the droplet 1150. The spread of the droplet 1150 depends on the kinetic energy at the time of colliding with the third substrate layer 285 and on the wettability of the solvent. In the case of very fine droplet 1150, the kinetic energy has a very small effect and the wettability has a dominant effect. When the droplet 1150 has a lower wettability and a greater wetting angle, the spread of the droplet 1150 is restricted, so that the fine pressure sensor 450 can be printed. However, if the wetting angle is too large, the droplets 1150 bounce and gather, so that the pressure sensor 450 may not be formed. Therefore, in order to obtain the high resolution pressure sensor 450, it is necessary to control the solvent selection or the surface condition of the third substrate layer 285 so as to obtain an appropriate wetting angle. It is desirable that the wetting angle should be approximately 30 to 70 degrees. The solvent of the droplet 1150 attached to the third substrate layer 285 is evaporated and the pressure sensor 450 is fixed. In this step, the drying rate is high because the size of the droplet 1150 is very small.

In addition, the method for forming the pressure sensor 450 on the third substrate layer 285 includes a screen printing method.

Figure 15:
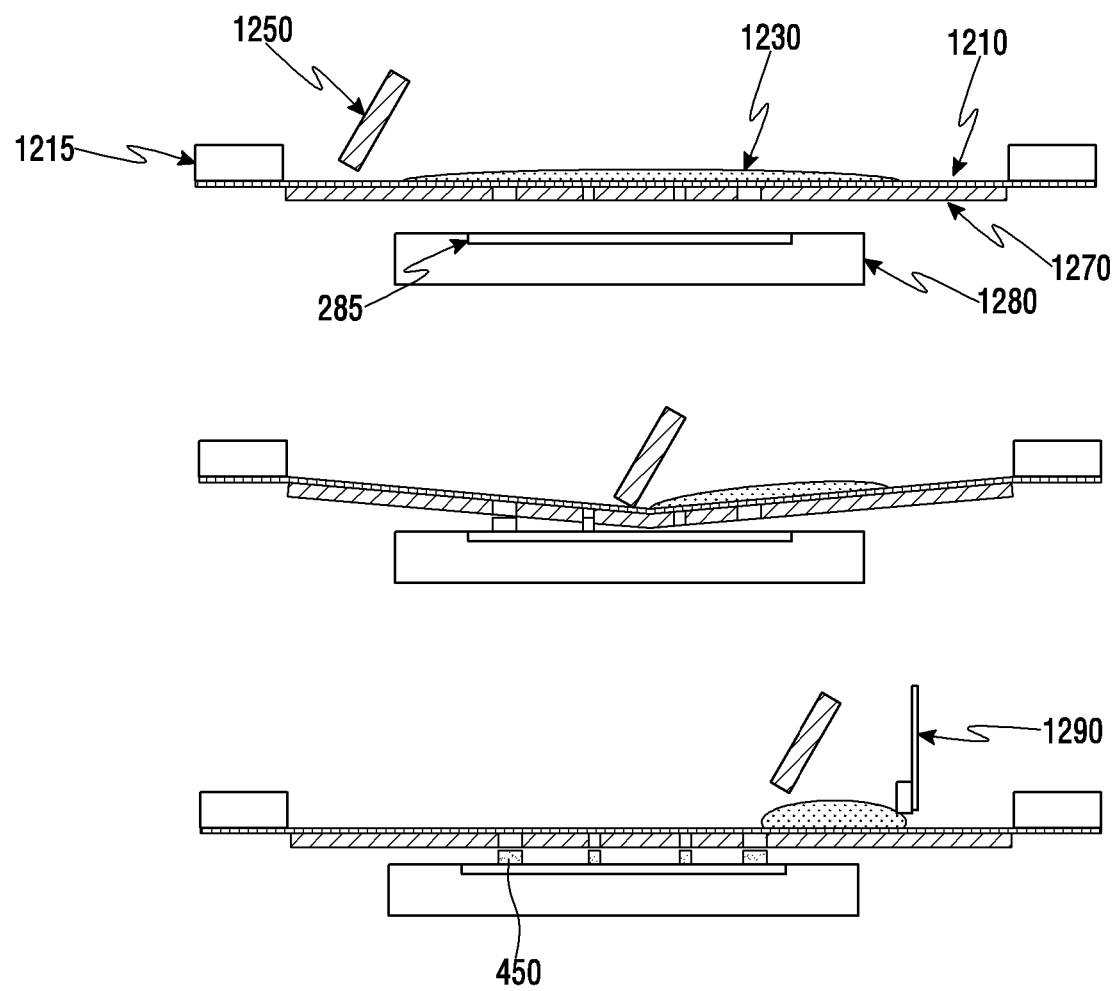

FIG. 15 is a view for describing a method for forming the pressure sensor 450 on the third substrate layer 285 by using the screen printing method.

As with the inkjet printing method, the screen printing method has a low material loss.

Referring to FIG. 15, a paste 1230, i.e., the pressure sensor constituent material, is placed on a screen 1210 pulled with a strong tension and a squeegee 1250 is moved while being pressed down. Then, the paste 1230 is pushed and transferred to the surface of the third substrate layer 285 through a mesh of the screen 1210.

In FIG. 15, a reference numeral 1215 represents a screen frame. A reference numeral 1270 represents plastic emulsion. A reference numeral 1280 represents Nest which is mounted on the third substrate layer 285. A reference numeral 1290 represents a flood blade.

The mesh of the screen 1210 may be made of stainless metal for the purpose of the fine pressure sensor 450. Since the paste 1230 needs an appropriate viscosity, the paste 1230 may be obtained by dispersing a resin or solvent in a basic material such as metal powder or semiconductor, etc. According to the screen printing method, while an interval of several millimeters is maintained between the screen 1210 and the third substrate layer 285, at the moment when the squeegee 1250 passes through the interval, the screen 1210 comes in contact with the third substrate layer 285 and the paste 1230 is transferred. Though the screen printing method is a contact type printing method, there is little effect of the third substrate layer 285 through the contact.

The screen printing method is performed through four basic processes such as rolling, discharging, plate separation, and leveling. The rolling means that the paste 1230 is rotated forward on the screen 1210 by the moving squeegee 1250. The rolling functions to stabilize the viscosity of the paste 1230 constantly and is an important process for obtaining a uniform thin film. The discharging means that the paste 1230 is pushed by the squeegee 1250, passes through between the screen 1210 and the mesh, and is pushed to the surface of the third substrate layer 285. The discharge force depends on the moving speed of the squeegee 1250 and an angle formed by the squeegee 1250 with the screen 1210. The less the angle of the squeegee 1250 is and the less the moving speed is, the greater the discharge force is. The plate separation means that the screen 1210 is separated from the third substrate layer 285 after the paste 1230 reaches the surface of the third substrate layer 285. The plate separation is a very important process for determining the resolution and continuous printability. The paste 1230 which has passed through the screen 1210 and has reached the third substrate layer 285 is spread with the fixing to the screen 1210 and the third substrate layer 285. Therefore, it is preferable that the paste 1230 should be immediately separated from the screen 1210. For this purpose, the screen 1210 needs to be pulled with a high tension. The paste 1230 which has been discharged on the third substrate layer 285 and has been plate-separated has fluidity. Therefore, the pressure sensor 450 is likely to change, so that a mark or pin hole, etc., is generated in the mesh. As time goes by, the viscosity is increased due to the evaporation of the solvent, etc., and the fluidity is lost. Eventually, the pressure sensor 450 is completed. This process is referred to as the leveling.

The printing condition of the pressure sensor 450 by the screen printing method depends on the following four factors. ① clearance for stable plate separation ② the angle of the squeegee 1250 for discharging the paste 1230 ③ the speed of the squeegee 1250, which affects the discharge of the paste 1230 and the plate separation speed, and ④ the pressure of the squeegee 1250 which scrapes the paste 1230 on the screen 1210.

The thickness of the pressure sensor 450 which is printed is determined by a discharge amount obtained through multiplication of the mesh thickness of the screen 1210 and an opening ratio. The accuracy of the pressure sensor 450 depends on the fineness of the mesh. For the purpose of rapid plate separation, the screen 1210 needs to be pulled with a strong tension. However, when a fine patterning is performed by using the screen 1210 having a thin mesh, the tension may exceed the limit of a dimension stability that the screen 1210 having a thin mesh can endure. However, by using the screen 1210 to which a wire of about 16 µm is applied, the pressure sensor 450 having a line width of less than 20 µm can be patterned.

In addition, the method for forming the pressure sensor 450 on the third substrate layer 285 includes a flexographic printing method.

Figure 16:
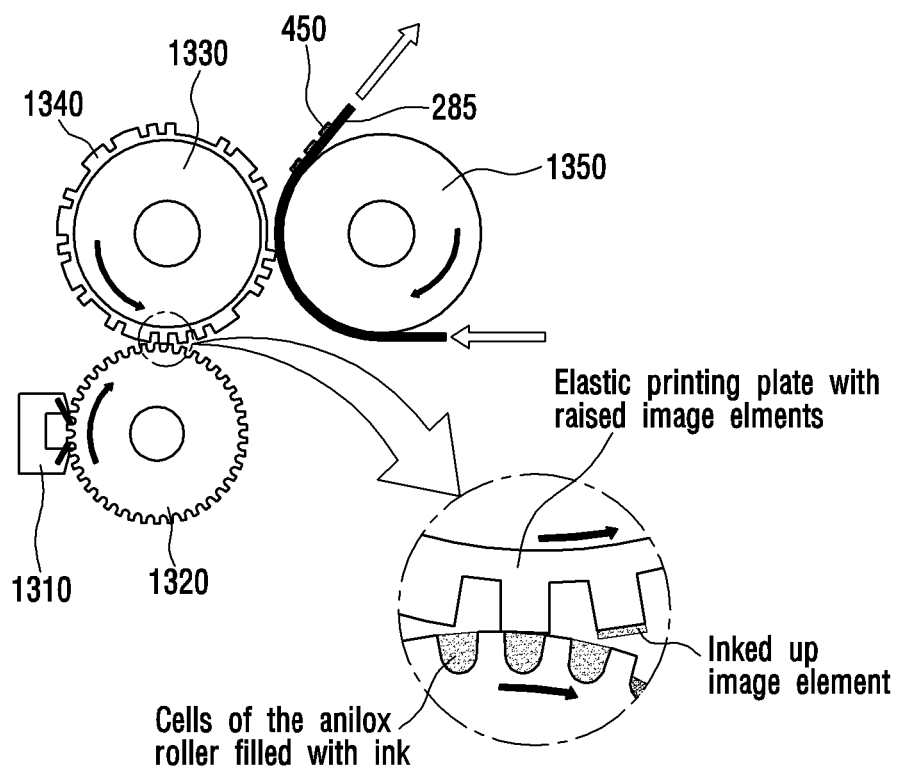

FIG. 16 is a view for describing a method for forming the pressure sensor 450 on the third substrate layer 285 by using the flexographic printing method.

Referring to FIG. 16, the ink, i.e., the pressure sensor constituent material which is supplied from a supplier 1310 is applied on an Anilox roller 1320 having a uniform grating, and is uniformly spread on the surface of the Anilox roller 1320 by using a doctor blade (not shown). Next, the ink spread on the surface of the Anilox roller 1320 is transferred in an embossed pattern to a soft printing substrate 1340 mounted on a printing cylinder 1330. Then, the ink transferred to the soft printing substrate 1340 is printed on the surface of the third substrate layer 285 which moves by the rotation of a hard printing roll 1350. As a result, the pressure sensor 450 is formed.

Regarding the flexographic printing method shown in FIG. 16, the thickness of the pressure sensor 450 which is printed on the third substrate layer 285 can be controlled by a pore size and density of the Anilox roller 1320, so that it is possible to form a uniform thin film. Also, the location or range in which the ink is applied can be precisely adjusted by changing the shape of the patterned pressure sensor 450. Therefore, the flexographic printing method can be also applied to printing using a flexible substrate.

The flexographic printing method is used to apply an alignment film of the LCD. A polyimide alignment film having a uniform thickness is formed by the flexographic printing method and a rubbing method is used. Meanwhile, as the size of the third substrate layer 285 is increased, the third substrate layer 285 after the six generation (1500× 1800) may have a form in which the printing roll 1350 moves.

Further, the method for forming the pressure sensor 450 on the third substrate layer 285 includes a transfer printing method. The transfer printing method includes a laser transfer printing method and a thermal transfer printing method.

Figure 17:
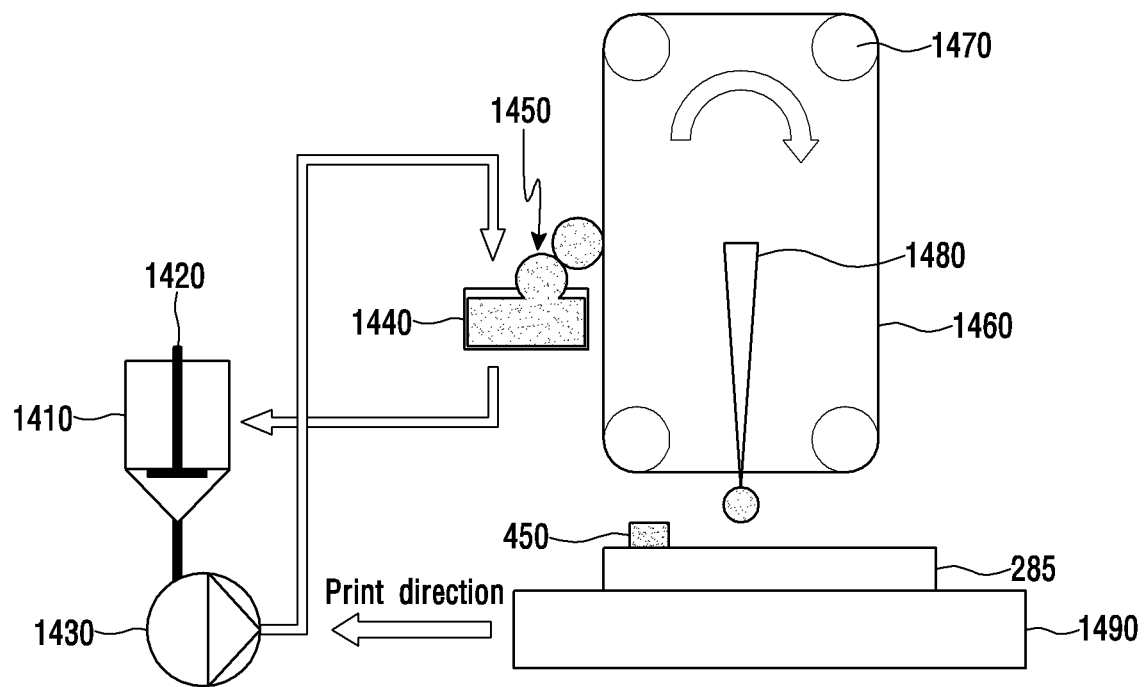

FIG. 17 is a view for describing a method for forming the pressure sensor 450 on the third substrate layer 285 by using the laser transfer printing method.

Referring to FIG. 17, the ink, i.e., the pressure sensor constituent material stored in a supplier 1410 is supplied to an ink station 1440 by a pump 1430. Here, the supplier 1410 may include a controller 1420 for controlling the viscosity and temperature of the ink.

The ink present in the ink station 1440 is coated on one side of a transparent endless belt 1460 by a roller 1450. Here, the transparent endless belt 1460 is rotated by a plurality of guide rollers 1470.

While the transparent endless belt 1460 is rotated by the guide roller 1470, laser 1480 is applied to the transparent endless belt 1460, so that the ink is transferred from the transparent endless belt 1460 to the surface of the third substrate layer 285. Through the control of the laser, predetermined ink is transferred to the third substrate layer 285 by heat generated by the laser and the pressure of the laser. The transferred ink becomes the pressure sensor 450. Here, the third substrate layer 285 is delivered in a predetermined print direction by a handling system 1490. Meanwhile, though not shown, the thermal transfer printing method is similar to the laser transfer printing method shown in FIG. 17. The thermal transfer printing method is that a heat radiating device that radiates high temperature heat is added to the transparent endless belt coated with the ink, and the pressure sensor 450 having a predetermined pattern is formed on the surface of the third substrate layer 285.

Through the transfer printing method including the laser transfer printing method and the thermal transfer printing method, there is an advantage in that it is possible to very precisely form the pressure sensor 450 transferred to the third substrate layer 285 such that the pressure sensor 450 has an accuracy of about ±2.5 µm.

The features, structures and effects and the like described in the embodiments are included in one embodiment of the present invention and are not necessarily limited to one embodiment. Furthermore, the features, structures, effects and the like provided in each embodiment can be combined or modified in other embodiments by those skilled in the art to which the embodiments belong. Therefore, contents related to the combination and modification should be construed to be included in the scope of the present invention.

Although embodiments of the present invention were described above, these are just examples and do not limit the present invention. Further, the present invention may be changed and modified in various ways, without departing from the essential features of the present invention, by those skilled in the art. For example, the components described in detail in the embodiments of the present invention may be modified. Further, differences due to the modification and application should be construed as being included in the scope and spirit of the present invention, which is described in the accompanying claims.

What is claimed is:

1. A method for manufacturing touch input devices, the method comprising:
    forming, on a single carrier substrate, a flexible display for each of a plurality of display devices;
    cutting the flexible display into individual pieces;
    separating the flexible display from the carrier substrate;
    forming, under a single substrate, a separate structure different from electrodes used to detect touch position for each of the plurality of display devices;
    disposing a light shielding layer for shielding the separate structure from light, the light shielding layer comprising at least one of: a black film, a black adhesive tape, or a black elastic material;
    cutting the substrate for the separate structure into individual pieces; and
    adhering each of the individual pieces of the separated flexible display to an individual piece of the substrate for the separate structure;
    wherein the substrate for the separate structure is not relatively easily bent as compared to the flexible display.

2. The method of claim 1, wherein the display forming step comprises:
    forming a second substrate layer on the carrier substrate;
    forming an organic material layer on the second substrate layer;
    forming a first substrate layer on the organic material layer;
    cutting the flexible display comprising the first substrate layer, the organic material layer, and the second substrate layer into individual pieces; and
    separating the cut flexible display from the carrier substrate by irradiating laser.

3. The method of claim 1, wherein the separate structure comprises a pressure electrode capable of detecting a touch pressure on the basis of a capacitance change amount according to the touch pressure on the touch input device.

4. The method of claim 1, wherein the separate structure comprises a strain gauge capable of detecting a touch pressure on the basis of a change of a resistance value due to the touch pressure on the touch input device.

5. The method of claim 1, wherein the light shielding layer for shielding the separate structure from light is formed under the single substrate and adjacent the separate structure.

6. The method of claim 1, wherein the light shielding layer for shielding the separate structure from light is formed under the single substrate and between the separate structure and the single substrate.

7. The method of claim 1, wherein the light shielding layer for shielding the separate structure from light is formed under the single substrate and not adjacent the single substrate.

8. A touch input device comprising:
   a cut flexible display which is cut into individual pieces for a plurality of display devices and is separated from a carrier substrate;
   a cut substrate for a separate structure different from electrodes used to detect touch position, which is cut into individual pieces for the plurality of display devices and has the separate structure formed thereon;
   a light shielding layer for shielding the separate structure from light, the light shielding layer comprising at least one of: a black film, a black adhesive tape, or a black elastic material; and
   an adhesive which adheres the separated cut flexible display to the substrate for the separate structure, which is cut into individual pieces;
   wherein the cut substrate for the separate structure is not relatively easily bent as compared to the flexible display.

9. The touch input device of claim 8, wherein the cut flexible display comprises:
   a second substrate layer formed on the carrier substrate;
   an organic material layer formed on the second substrate layer;
   a first substrate layer formed on the organic material layer;
   the individual cut pieces of the flexible display comprising the first substrate layer, the organic material layer, and the second substrate layer; and
   the cut flexible display separated from the carrier substrate by irradiating laser.

10. The touch input device of claim 8, wherein the separate structure comprises a pressure electrode capable of detecting a touch pressure on the basis of a capacitance change amount according to the touch pressure on the touch input device.

11. The touch input device of claim 8, wherein the separate structure comprises a strain gauge capable of detecting a touch pressure on the basis of a change of a resistance value due to the touch pressure on the touch input device.

12. A method for manufacturing a touch input device, the method comprising:
   forming, on a single carrier substrate, a flexible display for each of a plurality of display devices;
   separating the flexible display from the carrier substrate;
   forming, under a single substrate, a separate structure different from electrodes used to detect touch position for each of the plurality of display devices;
   disposing a light shielding layer for shielding the separate structure from light, the light shielding layer comprising at least one of: a black film, a black adhesive tape, or a black elastic material;
   adhering the separated flexible display to the substrate for the separate structure; and
   cutting the substrate for the separate structure and the flexible display which have been adhered to each other into individual pieces;
   wherein the substrate for the separate structure is not relatively easily bent as compared to the flexible display.

13. The method of claim 12, wherein the separate structure comprises a pressure electrode capable of detecting a touch pressure on the basis of a capacitance change amount according to the touch pressure on the touch input device.

14. The method of claim 12, wherein the separate structure comprises a strain gauge capable of detecting a touch pressure on the basis of a change of a resistance value due to the touch pressure on the touch input device.

15. The method of claim 12, wherein a light shielding layer for shielding the separate structure from light is formed under the single substrate and adjacent the separate structure.

* * * * *